(12) United States Patent
Yazami et al.

(10) Patent No.: US 11,598,816 B2
(45) Date of Patent: Mar. 7, 2023

(54) METHOD AND SYSTEM FOR ONLINE ASSESSING STATE OF HEALTH OF A BATTERY

(71) Applicant: Yazami IP PTE. LTD., Singapore (SG)

(72) Inventors: Rachid Yazami, Singapore (SG); Sohaib El Outmani, Grenoble (FR)

(73) Assignee: Yazami IP PTE. LTD., Singapore (SG)

( * ) Notice: Subject to any disclaimer, the term of this patent is extended or adjusted under 35 U.S.C. 154(b) by 81 days.

(21) Appl. No.: 16/770,555

(22) PCT Filed: Dec. 7, 2018

(86) PCT No.: PCT/IB2018/059755
§ 371 (c)(1),
(2) Date: Jun. 5, 2020

(87) PCT Pub. No.: WO2019/162749
PCT Pub. Date: Aug. 29, 2019

(65) Prior Publication Data
US 2021/0055353 A1 Feb. 25, 2021

(30) Foreign Application Priority Data
Dec. 7, 2017 (SG) ............................ 10201710153U

(51) Int. Cl.
*G01R 31/392* (2019.01)
*G01R 31/367* (2019.01)
*H02J 7/00* (2006.01)

(52) U.S. Cl.
CPC ......... *G01R 31/392* (2019.01); *G01R 31/367* (2019.01); *H02J 7/005* (2020.01); *H02J 7/0048* (2020.01)

(58) Field of Classification Search
CPC ............... G01R 31/392; G01R 31/367; G01R 31/3835; H02J 7/005; H02J 7/0048; Y02E 60/10; H01M 10/48; H01M 10/44
See application file for complete search history.

(56) References Cited

U.S. PATENT DOCUMENTS 8,901,892 B2 * 12/2014 Yazami ................... H02J 7/007
320/152
9,847,558 B1 * 12/2017 Wang ..................... H01M 10/48
(Continued)

FOREIGN PATENT DOCUMENTS

| EP | 2841956 B1 | 2/2019 |
| WO | 2010/105062 A1 | 9/2010 |

OTHER PUBLICATIONS

Andrea et al., "Characterization of High-Power Lithium-Ion Batteries by Electrochemical Impedance Spectroscopy. I. Experimental Investigation," Journal of Power Sources, vol. 196, (2011), pp. 5334-5341.
(Continued)

*Primary Examiner* — Stacy Whitmore
(74) *Attorney, Agent, or Firm* — TraskBritt

(57) ABSTRACT

A method for online assessing a state of health (SOH) of an electrochemical cell, comprises a step for estimating the state of health (SOH) of the electrochemical cell from thermodynamics data related to the cell the thermodynamics data including entropy and enthalpy variations $\Delta S$, $\Delta H$ within the cell. A system for fast-charging a rechargeable battery with terminals connected to internal electrochemical cells, comprises a power supply connected to the rechargeable battery and arranged for applying a time-varying charging voltage to the battery terminals, a charging-control processor for controlling the power supply, and a system for online assessing a state of health (SOH) of the battery, the SOH assessment system comprising means for estimating
(Continued)

the state of health (SOH) of the electrochemical cell from thermodynamics data related to the battery.

19 Claims, 31 Drawing Sheets

(56) References Cited

U.S. PATENT DOCUMENTS

| | | | | |
|---|---|---|---|---|
| 2007/0182418 | A1* | 8/2007 | Reynier | H01M 10/60 324/429 |
| 2010/0090650 | A1* | 4/2010 | Yazami | G01R 31/382 324/426 |
| 2013/0322488 | A1* | 12/2013 | Yazami | B60L 58/15 374/100 |
| 2014/0092375 | A1* | 4/2014 | Raghavan | H01M 10/48 356/32 |
| 2016/0146895 | A1* | 5/2016 | Yazami | H02J 7/0047 324/426 |
| 2016/0190833 | A1* | 6/2016 | Roumi | H02J 7/0021 320/136 |
| 2017/0108552 | A1* | 4/2017 | Roumi | G01R 31/392 |
| 2017/0146608 | A1* | 5/2017 | Lee | G01R 31/3828 |
| 2017/0229891 | A1* | 8/2017 | Lee | H02J 7/007192 |
| 2018/0292465 | A1* | 10/2018 | Osara | G01N 33/2888 |
| 2018/0321323 | A1* | 11/2018 | Dubarry | G01R 31/3835 |
| 2019/0187004 | A1* | 6/2019 | Durrer | H01M 10/425 |
| 2020/0292622 | A1* | 9/2020 | Wu | G01R 31/367 |
| 2021/0091421 | A1* | 3/2021 | Yazami | H01M 10/4257 |

OTHER PUBLICATIONS

Andrea et al., "Characterization of High-Power Lithium-Ion Batteries by Electrochemical Impedance Spectroscopy II: Modelling," Journal of Power Sources, vol. 196, (2011), pp. 5349-5356.
Berecibar et al., "Critical Review of State of Health Estimation Methods of Li-Ion Batteries for Real Applications," Renewable and Sustainable Energy Reviews, vol. 56, (2016), pp. 572-587.
Blanke et al., "Impedance Measurements on Lead-Acid Batteries for State-of-Charge, State-of-Health and Cranking Capability Prognosis in Electric and Hybrid Electric Vehicles," Journal of Power Sources, vol. 144, (2005), pp. 418-425.
Buschel et al., "Use of Stochastic Methods for Robust Parameter Extraction from Impedance Spectra," Electrochimica. Acta., vol. 56, (2011), pp. 8069-8077.
Chiang et al., "Online Estimation of Internal Resistance and Open-Circuit Voltage of Lithium-Ion Batteries in Electric Vehicles," Journal of Power Sources, vol. 196, (2011), pp. 3921-3932.
Galeotti et al., "Diagnostic Methods for the Evaluation of the State of Health (SOH) of NiMH Batteries Through Electrochemical Impedance Spectroscopy," 23rd International Symposium on Industrial Electronics (ISIE), (2014), pp. 1641-1646.
Gandolfo et al., "Dynamic Model of Lithium Polymer Battery—Load Resistor Method for Electric Parameters Identification," Journal of the Energy Institute, vol. 88, (2015), pp. 470-479.
Haifeng et al., "A New SOH Prediction Concept for the Power Lithium-ion Battery Used on HEVs," IEEE, (2009), pp. 1649-1653.
Hatzell et al., "A Survey of Long-Term Health Modeling, Estimation, and Control of Lithium-Ion Batteries: Challenges and Opportunities," American Control Conference, (Jun. 27-Jun. 29, 2012), pp. 584-591.

Huet, A Review of Impedance Measurements for Determination of the State-of-Charge or State-of-Health of Secondary Batteries, Journal of Power Sources, vol. 70, (1998), pp. 59-69.
Kozlowski et al., "Electrochemical Cell Prognostics Using Online Impedance Measurements and Model-Based Data Fusion Techniques," IEEE, 2003, vol. 7-3257, pp. 1-14.
Maher et al., "A Study of Lithium Ion Batteries Cycle Aging by Thermodynamics Techniques," Journal of Power Sources, vol. 247, (2014), pp. 527-533.
Maher et al., "A Thermodynamic and Crystal Structure Study of Thermally Aged Lithium Ion Cells," Journal of Power Sources, vol. 261, (2014), pp. 389-400.
Maher et al., "Effect of overcharge on entropy and enthalpy of lithium-ion batteries," Electrochimica. Acta., vol. 101, (2013), pp. 71-78.
Matsushima, "Deterioration Estimation of Lithium-Ion Cells in Direct Current Power Supply Systems and Characteristics of 400-Ah Lithium-Ion Cells," Journal of Power Sources, vol. 189, (2009), pp. 847-854.
Meissner et al., "The Challenge to the Automotive Battery Industry: the Battery has to Become an Increasingly Integrated Component Within the Vehicle Electric Power System," Journal of Power Sources, vol. 144, (2005), pp. 438-460.
Meissner et al., "Vehicle Electric Power Systems are Under Change! Implications for Design, Monitoring and Management of Automotive Batteries," Journal of Power Sources, vol. 95, (2001), pp. 13-23.
Ng et al., "Enhanced Coulomb Counting Method for Estimating State-of-Charge and State-of-Health of Lithium-Ion Batteries," Applied Energy, vol. 86, (2009), pp. 1506-1511.
Plett, "Extended Kalman Filtering for Battery Management Systems of LiPB-Based HEV Battery Packs Part 1. Background," Journal of Power Sources, vol. 134, (2004), pp. 252-261.
Plett, "Extended Kalman Filtering for Battery Management Systems of LiPB-Based HEV Battery Packs Part 2. Modeling and identification," Journal of Power Sources, vol. 134, (2004), pp. 262-276.
Plett, "Extended Kalman Filtering for Battery Management Systems of LiPB-Based HEV Battery Packs Part 3. State and Parameter Estimation," Journal of Power Sources, vol. 134, (2004), pp. 277-292.
Remmlinger et al., "On-Board State-of-Health Monitoring of Lithium-Ion Batteries Using Linear Parameter-Varying Models," Journal of Power Sources, vol. 239, (2013), pp. 689-695.
Remmlinger et al., "State-of-Health Monitoring of Lithium-Ion Batteries in Electric Vehicles by on-Board Internal Resistance Estimation," Journal of Power Sources, vol. 196, (2011), pp. 5357-5363.
Sauvant-Moynot et al., "Alidissi, a Research Program to Evaluate Electrochemical Impedance Spectroscopy as a SoC and SoH Diagnosis Tool for Li-Ion Batteries," Oil & Gas Science and Technology—Rev. IFP, vol. 65 (2010), pp. 79-89.
Schweiger et al., "Comparison of Several Methods for Determining the Internal Resistance of Lithium Ion Cells," Sensors, vol. 10, (2010), pp. 5604-5625.
Wei et al., "Internal Resistance Identification in Vehicle Power Lithium-Ion Battery and Application in Lifetime Evaluation," International Conference on Measuring Technology and Mechatronics Automation, (2009), pp. 388-392.
International Search Report for International Application No. PCT/IB2018/059755 dated Apr. 10, 2019, 3 pages.
International Written Opinion for International Application No. PCT/IB2018/059755 dated Apr. 10, 2019, 7 pages.
European Communication pursuant to Article 94(3) EPC for European Application No. 18842556, dated Dec. 7, 2021, 6 pages.

* cited by examiner

| | | | |
|---|---|---|---|
| 1.1 ☆ | Tree | Accuracy: 92.9% | |
| Last change: | Complex Tree | 20/20 features | |
| 1.2 ☆ | Tree | Accuracy: 92.9% | |
| Last change: | Medium Tree | 20/20 features | |
| 1.3 ☆ | Tree | Accuracy: 86.5% | |
| Last change: | Simple Tree | 20/20 features | |
| 1.4 ☆ | Linear Discriminant | Accuracy: 87.3% | |
| Last change: | Linear Discriminant | 20/20 features | |
| 1.5 ☆ | Quadratic Discriminant | Accuracy: 97.6% | |
| Last change: | Quadratic Discriminant | 20/20 features | |
| 1.6 ☆ | SVM | Accuracy: 96.8% | |
| Last change: | Linear SVM | 20/20 features | |
| 1.7 ☆ | SVM | Accuracy: 100.0% | |
| Last change: | Quadratic SVM | 20/20 features | |
| 1.8 ☆ | SVM | Accuracy: 100.0% | |
| Last change: | Cubic SVM | 20/20 features | |
| 1.9 ☆ | SVM | Accuracy: 89.7% | |
| Last change: | Fine Gaussian SVN | 20/20 features | |
| 1.10 ☆ | SVM | Accuracy: 100.0% | |
| Last change: | Medium Gaussian SVM | 20/20 features | |
| 1.11 ☆ | SVM | Accuracy: 87.3% | |
| Last change: | Coarse Gaussian SVM | 20/20 features | |
| 1.12 ☆ | KNN | Accuracy: 100.0% | |
| Last change: | Fine KNN | 20/20 features | |
| 1.13 ☆ | KNN | Accuracy: 91.3% | |
| Last change: | Medium KNN | 20/20 features | |
| 1.14 ☆ | KNN | Accuracy: 30.2% | |
| Last change: | Coarse KNN | 20/20 features | |
| 1.15 ☆ | KNN | Accuracy: 92.9% | |
| Last change: | Cosine KNN | 20/20 features | |
| 1.16 ☆ | KNN | Accuracy: 92.1% | |
| Last change: | Cubic KNN | 20/20 features | |
| 1.17 ☆ | KNN | Accuracy: 99.2% | |
| Last change: | Weighted KNN | 20/20 features | |
| 1.18 ☆ | Ensemble | Accuracy: 30.2% | |
| Last change: | Boosted Trees | 20/20 features | |
| 1.19 ☆ | Ensemble | Accuracy: 99.2% | |
| Last change: | Bagged Trees | 20/20 features | |
| 1.20 ☆ | Ensemble | Accuracy: 98.4% | |
| Last change: | Subspace Discriminant | 20/20 features | |
| 1.21 ☆ | Ensemble | Accuracy: 100.0% | |
| Last change: | Subspace KNN | 20/20 features | |
| 1.22 ☆ | Ensemble | Accuracy: 87.3% | |
| Last change: | RUSBoosted Trees | 20/20 features | |

Comparison of different pattern recognition algorithms that identify a battery reference

FIG. 28

METHOD AND SYSTEM FOR ONLINE ASSESSING STATE OF HEALTH OF A BATTERY

CROSS-REFERENCE TO RELATED APPLICATIONS

This application is a national phase entry under 35 U.S.C. § 371 of International Patent Application PCT/IB2018/059755, filed Dec. 7, 2018, designating the United States of America and published as International Patent Publication WO 2019/162749 A1 on Aug. 29, 2019, which claims the benefit under Article 8 of the Patent Cooperation Treaty to Singapore Patent Application Serial No. 10201710153U, filed Dec. 7, 2017.

TECHNICAL FIELD

The present disclosure relates to a method for online assessing state of health of a battery (SOH). It also relates to a system implementing the online SOFT assessing method.

BACKGROUND

Over the last decades Energy Storage Systems (ESS) surrounded us. We are at their contact every day. With smartphones, laptops and others embedded systems hundreds of millions of lithium-ion batteries are produced each year. Moreover, with the expecting growing of electric vehicles market, even more batteries will be manufactured.

With such an amount of batteries used all over the world, it is important to ensure safety and reliability of the ESS. In order to achieve those requirements, a batteries management system (BMS) has to be used. The BMS is an electronic system that manages the battery to guarantee its safe operation. It elaborates a diagnosis from measurements and provides an optimal management of the ESS.

One part of the diagnosis is to estimate the state of health (SOH). It is a very important characteristic for a cell as well as for a pack. SOH is an indicator that evaluates the ageing of a battery compared to its fresh state. Knowing the SOH is useful for predicting when the battery should be removed. And if the battery is not operating normally, it is impacted on this indicator. Moreover to be able to perform an adaptive charging, this parameter is needed. Indeed since the battery is evolving with time, at the charging process, SOH should be used to improve battery life.

Currently SOH is assessed mostly by testing a battery during charging and discharging at a certain rate. This enables discharge capacity and voltage to be determined. Then SOH can be defined as the ratio of capacity or energy of a used battery vs. the same of a fresh one. The need to fully charge and discharge a cell is not practical to assess battery SOH on real-time basis.

This parameter SOH is difficult to estimate because it cannot be directly measured. Different estimation methods have been developed. Each of them has advantages and drawbacks.

The purpose of the present disclosure is to overcome these drawbacks by proposing a new method for assessing SOH.

BRIEF SUMMARY

This goal is achieved with a method for online assessing a state of health (SOH) of an electrochemical cell, the method comprising a step for estimating the state of health (SOH) of the electrochemical cell from thermodynamics data related to the cell, the thermodynamics data including entropy and enthalpy variations $\Delta S$, DH within the cell.

The SOS assessment method according to the present disclosure can further comprise a step for identifying the reference and chemistry of the electrochemical cell, or a step for implementing a model providing relationships between entropy $\Delta S$ and the state of health (SOH) for the electrochemical cell.

In a particular embodiment of the present disclosure, the $\Delta S$-SOH model has been previously obtained off line from analyzing entropy data and relating the entropy data analysis to chemical characteristics of the electrochemical cell and then to the state of health (SOH) of the cell.

The $\Delta S$-SOH model can be implemented within an entropy-revealer tool dedicated to state of health (SOH) assessment. This entropy-revealer tool can be adapted to fill and update a database on thermodynamics and/or chemistry and/or state of health (SOH).

The entropy-revealer tool can be advantageously adapted to generate machine-learning models.

In a specific version of a SOH-assessment method of the present disclosure, implemented for a not already known battery, the entropy-revealer tool is adapted to identify the type of the battery by accessing the database and machine learning models, and then to deliver an estimation of the state of health (SOH) with previously found learning models.

The off-line entropy analysis can detect particular open-circuit voltage (OCV) values where $\Delta S$ changes are more pronounced as the electrochemical cell ages.

The relationships between the entropy variations $\Delta S$ and the state of health (SOH) are established by using pattern recognition algorithms.

The step of estimating the state of health (SOH) comprises a step of estimating the state of health (SOH) from entropy variation $\Delta S$ profiles.

The step of estimating the state of health (SOH) comprises a step of estimating the state of health (SOH) from enthalpy variation DH profiles.

The entropy-revealer tool is adapted to estimate the state of health (SOH) of an electrochemical cell including a chemistry not yet referenced in the database.

The step of estimating the state of health (SOH) from thermodynamics data can advantageously comprise:
  measuring profiles of open-circuit voltage (OCV), $\Delta S$ and DH, for different battery references and chemistries,
  measuring profiles of OCV, $\Delta S$ and $\Delta H$, for different battery states of health,
  defining which part of the profiles is the most interesting regarding identification and SOH estimation.
  finding a relationship between OCV, $\Delta S$ and $\Delta H$ profiles in one hand and battery reference or chemistry in another hand with a model.

The step of estimating the state of health (SOH) of a battery can comprise:
  measuring thermodynamics profiles,
  identifying the reference of the battery by using the entropy-revealer tool and from the measured thermodynamics profiles,
  estimating the state of health (SOH) by using the entropy-revealer tool and from the measured thermodynamics profiles.

According to another aspect of the present disclosure, it is proposed a system for online assessing a state of health (SOH) of an electrochemical cell, the system comprising means for estimating the state of health (SOH) of the electrochemical cell from thermodynamics data related to the cell, the thermodynamics data including entropy and enthalpy variations ΔS, ΔH within the cell.

The SOH assessment system according to the present disclosure can further comprise means for identifying the reference and chemistry of the electrochemical cell.

The SOH assessment system according to the present disclosure can further comprise means for implementing a model providing relationships between entropy ΔS and the state of health (SOH) for the electrochemical cell.

The SOH assessment system according to the present disclosure can further comprise an entropy-revealer tool implementing the ΔS-SOH model.

The SOH assessment system according to the present disclosure can further comprise a database on thermodynamics and/or chemistry and/or state of health (SOH), the database being filled and updated by the entropy-revealer tool.

The SOH assessment system according to the present disclosure can further implement machine-learning models generated by the entropy-revealer tool.

The SOH assessment system according to the present disclosure can further comprise means for detecting particular open-circuit voltage (OCV) values where ΔS changes are more pronounced as the electrochemical cell ages.

The SOH assessment system according to the present disclosure can further implement pattern recognition algorithms used for establishing the relationships between the entropy variations ΔS and the state of health (SOH).

The SOH estimation means can advantageously comprise:
  means for measuring profiles of open-circuit voltage (OCV), ΔS and ΔH, for different battery references and chemistries,
  means for measuring profiles of OCV, ΔS and ΔH, for different battery states of health,
  means for defining which part of the profiles is the most interesting regarding identification and SOH estimation.
  Means for finding a relationship between OCV, ΔS and ΔH profiles in one hand and battery reference or chemistry in another hand with a model.

The SOH estimation means can also comprise:
  means for measuring thermodynamics profiles,
  means for identifying the reference of the battery by using the entropy-revealer tool and from the measured thermodynamics profiles,
  means for estimating the state of health (SOH) by using the entropy-revealer tool and from the measured thermodynamics profiles.

According to another aspect of the present disclosure, it is proposed a system for fast-charging a rechargeable battery with terminals connected to internal electrochemical cells, the fast-charging system comprising:
  a power supply connected to the rechargeable battery and arranged for applying a time-varying charging voltage to the battery terminals, thereby generating a charging current resulting in charging of the electrochemical cells,
  a charging-control processor for controlling the power supply,
  the fast-charging system further comprising a system for online assessing a state of health (SOH) of the battery, the SOH assessment system comprising means for estimating the state of health (SOH) of the electrochemical cell from thermodynamics data related to the battery, the thermodynamics data including entropy and enthalpy variations ΔS, DH within the cell.

Battery state of health (SOH) is a key parameter as SOH controls the energy and the power performances of a battery together with it cycle and calendar life. SOH can be used to apply an adapted charging protocol. SOH gives valuable information on battery state of safety (SOS). Accurate SOH assessment is very important for performance and life prediction.

A new online method has been developed to assess battery SOH by the profile analysis of open-circuit voltage (OCV), entropy ΔS and enthalpy ΔH. A tool called "Entropy Revealer" (ER) is created and used for the purpose of SOH assessment. ER is based on a software that analyzes entropy data and relate them to a chemistry and then to SOH. The newly developed program automatically detects particular OCV values where ΔS changes are more pronounced as battery ages. A relationship between Entropy and SOH is then established by ER using pattern recognition algorithms. Then the models found can be used online for different applications such as smart and fast charging and for battery safety risk assessment.

BRIEF DESCRIPTION OF THE DRAWINGS

These and other features and advantages of the present disclosure will become better understood with regard to the following description, appended claims, and accompanying drawings wherein:

FIG. 28 shows a comparison of different pattern recognition algorithms that identify a battery reference.

DETAILED DESCRIPTION

Thermodynamics of batteries can be seen as "fingerprints." Indeed thermodynamic data are directly linked to batteries microscopic structure. It can give us information about chemistry, age, state of charge. It is then possible to use thermodynamics for identification and characterization of batteries.

Digital fingerprint is a good analogy. The signature is unique for each individual, and statically this assertion is verified. The analogy can be pushed to the reference level. Indeed, it was observed that the thermodynamic profiles, especially ΔS, are different from one reference to another. It is the same for batteries with the same reference.

There is a better analogy than digital fingerprint. The digital fingerprint is invariant with human age or shape. It is of the same kind as DNA profiling. No matter what is the shape or the age of the person, DNA and digital fingerprint are not affected.

Thermodynamics profile are closer to voice or human face regarding this aspect. By looking at a face it is possible to recognize someone, to give its age, to have an idea of how well this person is. And there are several algorithms that use face characteristics from a picture to recognize someone, to determine its gender and even to estimate its age.

Same considerations can be made with the voice. Analogy can be even pushed further with batteries. Voice is the reflection of anatomic features such as size and shape of throat and mouth. Entropy of a battery is the reflection of internal microscopic structure and state of charge of anode and cathode. Voice can give us information about the gender. Entropy can give us information on the battery chemistry.

It is possible to estimate the age of a person with its voice. In the same fashion it is possible to estimate the age of a battery from its entropic profile. One can tell if a person is smoking just by hearing its voice. One can also tell if a battery was overheated or overcharged from its Entropy profile.

Various technologies are used to address the process and the storage of voice printing: pattern matching algorithms, neural networks, matrix representation, Vector Quantization, or decision trees. Same kind of techniques can be used as well to process thermodynamics fingerprint of a battery.

Entropy of a battery can be seen as their voice. We need to "listen" carefully to them to know more about them. Their "voice" can tell us who they are and how they feel.

Thermodynamic fingerprints for batteries include two components: Entropic and enthalpic fingerprints. These fingerprints are measured and processed to estimate the state of health.

Figure 1:
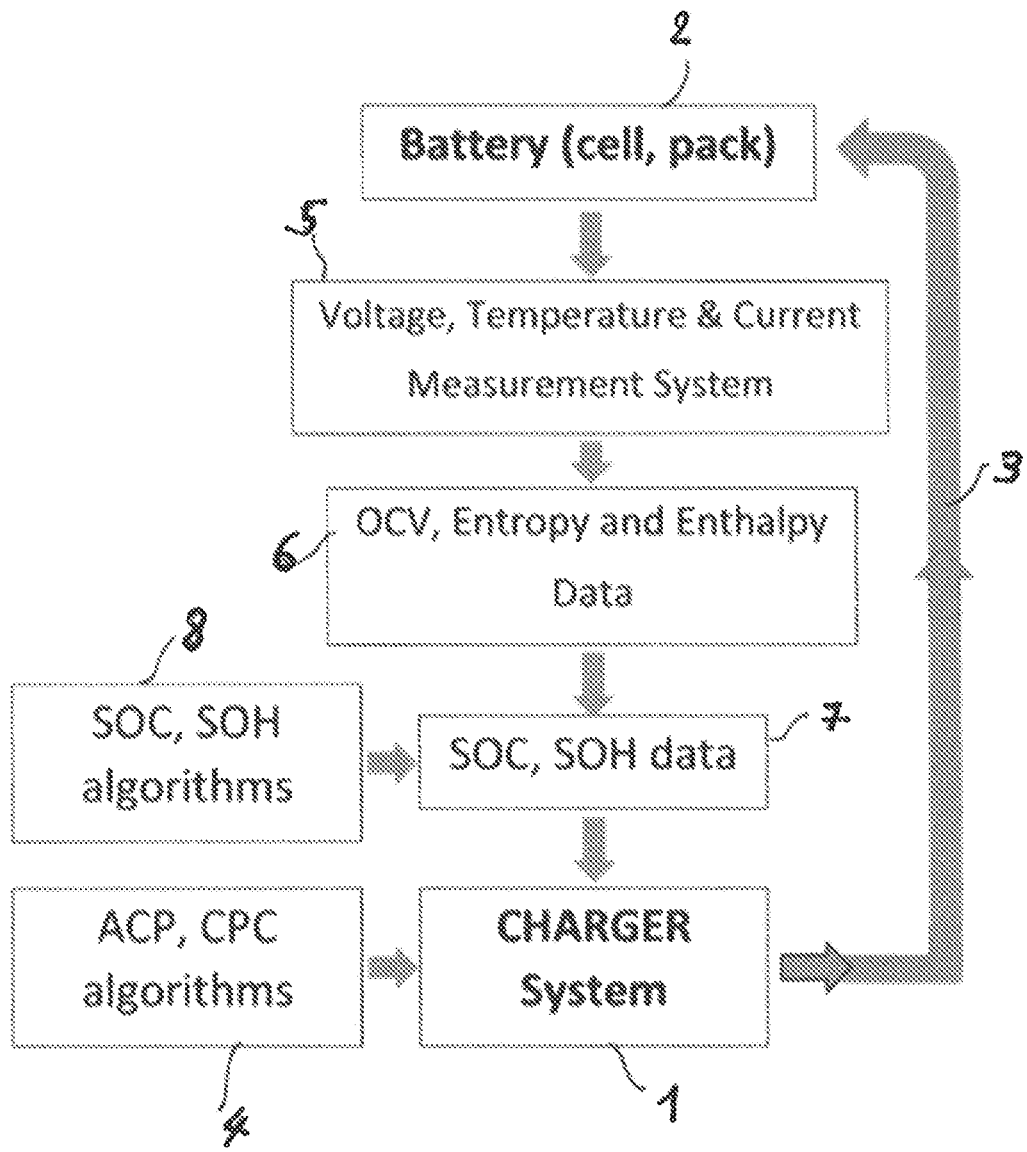
FIG. 1 is a functional scheme of a fast-charging system implementing the SOH-assessment method according to the present disclosure.
Figure 2:
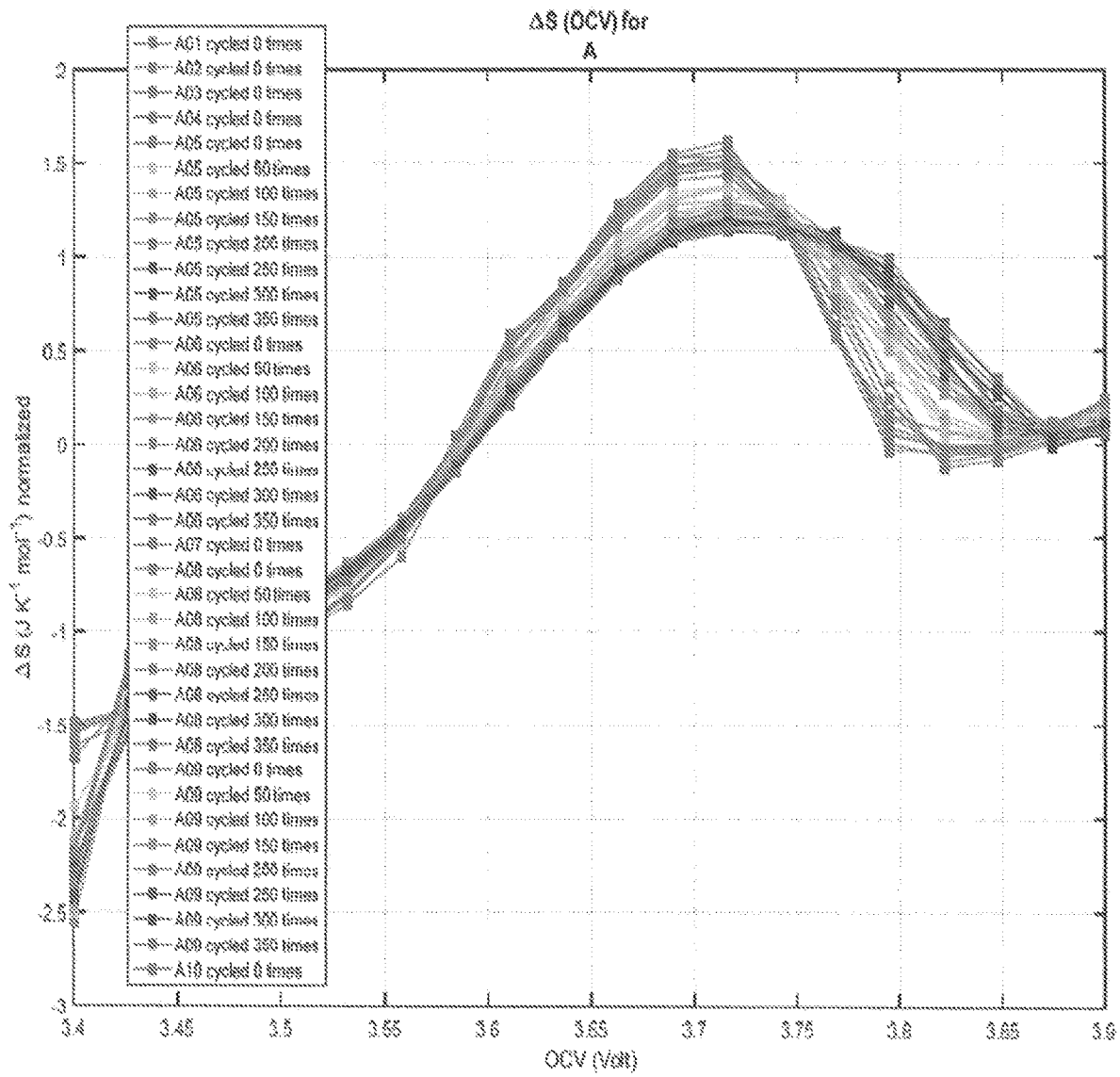
FIG. 2 illustrates ΔS (OCV) profiles for ten different batteries from reference A, four of which are aged.
Figure 3:
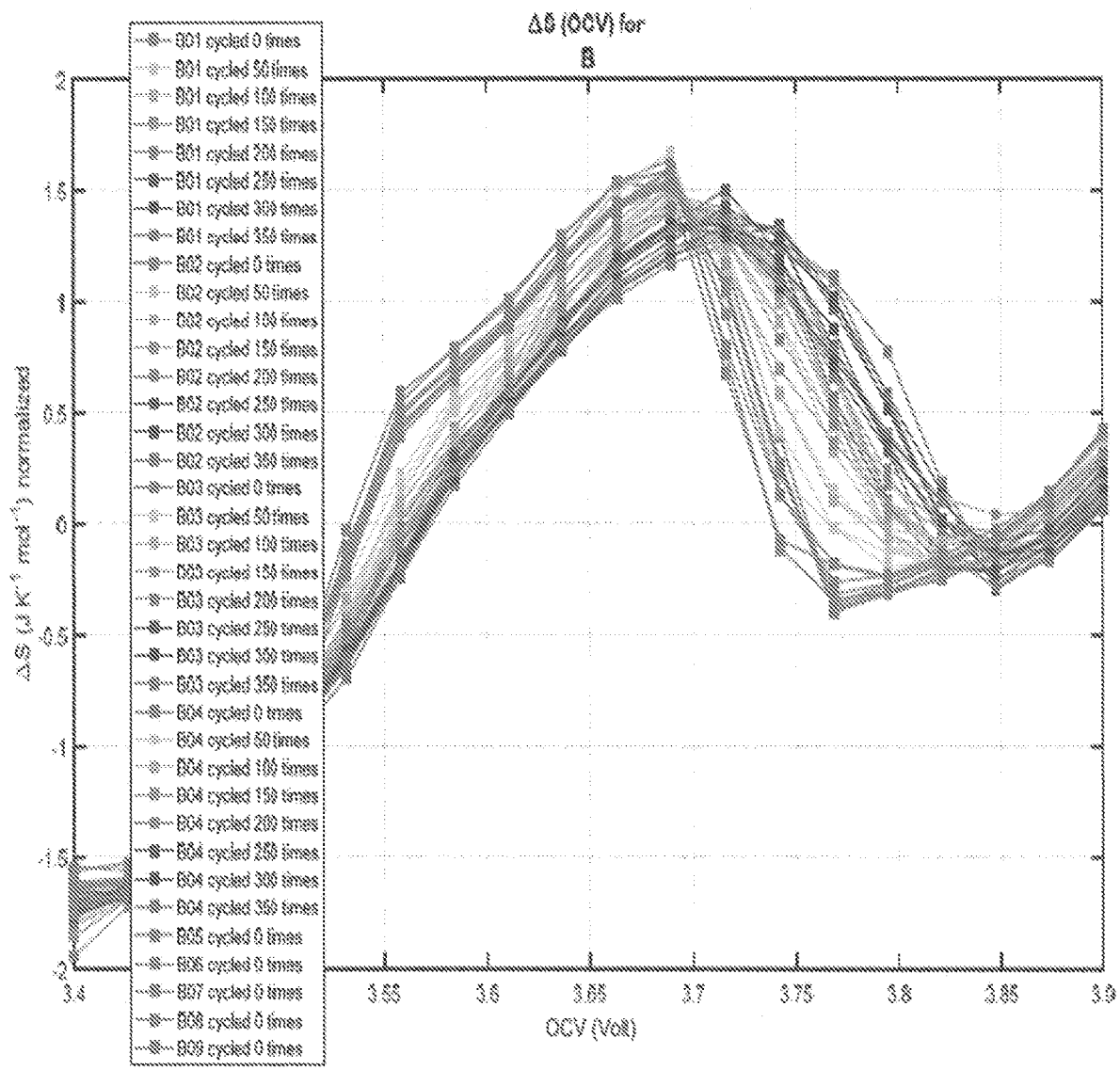
FIG. 3 illustrates ΔS (OCV) profiles for nine different batteries from reference B, four of which are aged.
Figure 4:
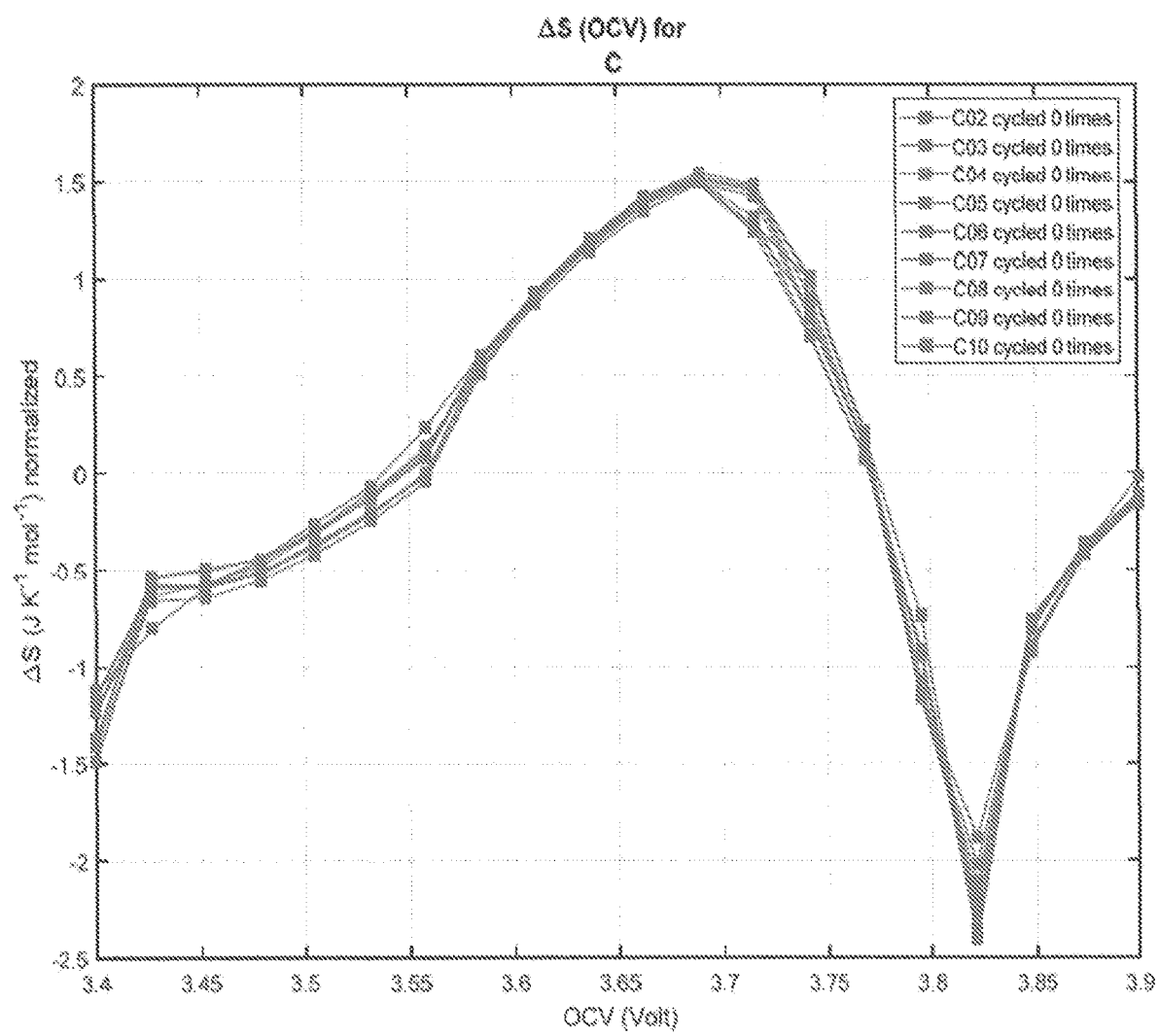
FIG. 4 illustrates ΔS (OCV) profiles for nine different batteries from reference C.
Figure 5:
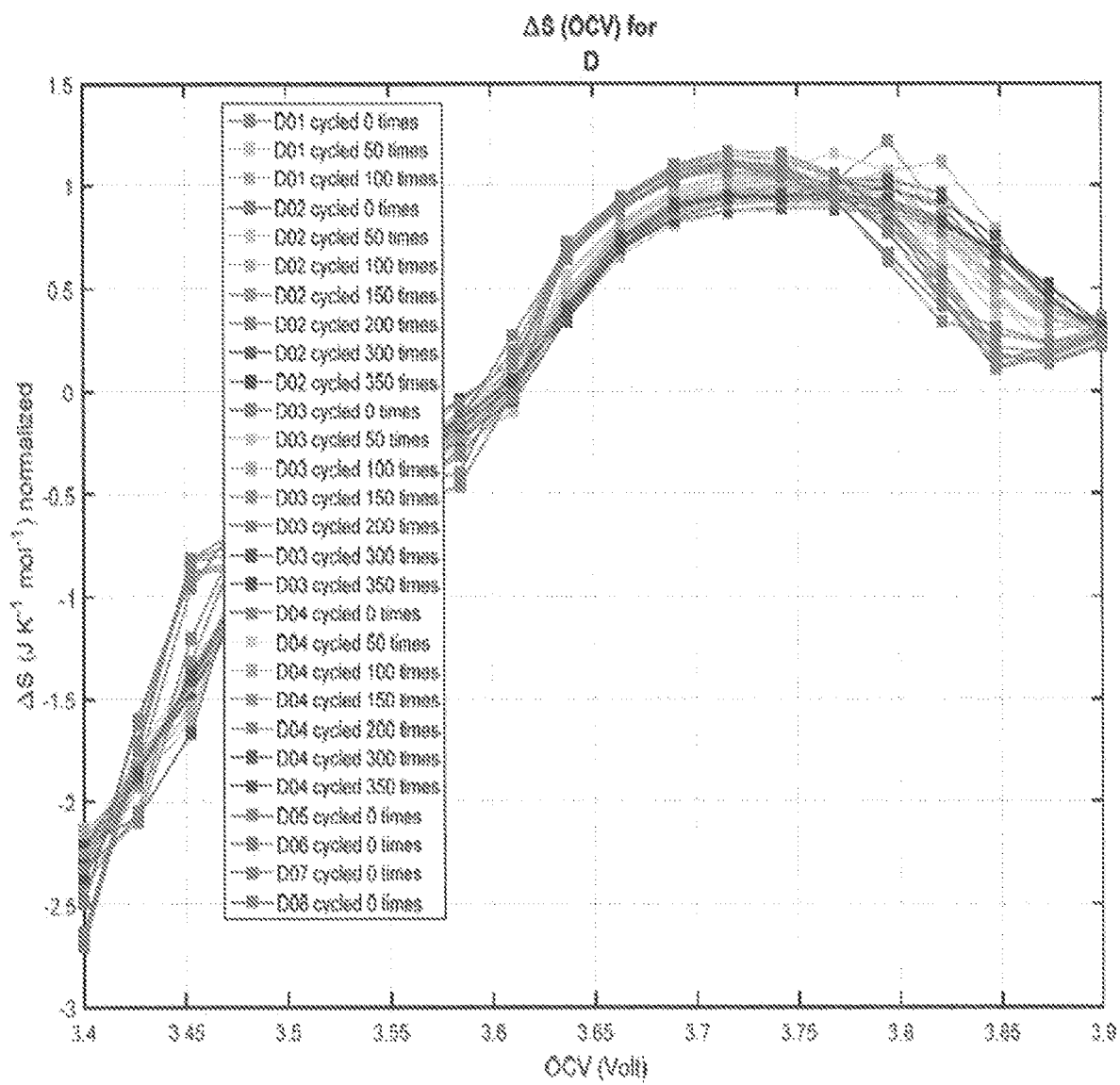
FIG. 5 illustrates ΔS (OCV) profiles for eight different batteries from reference D, four of which are aged.
Figure 6:
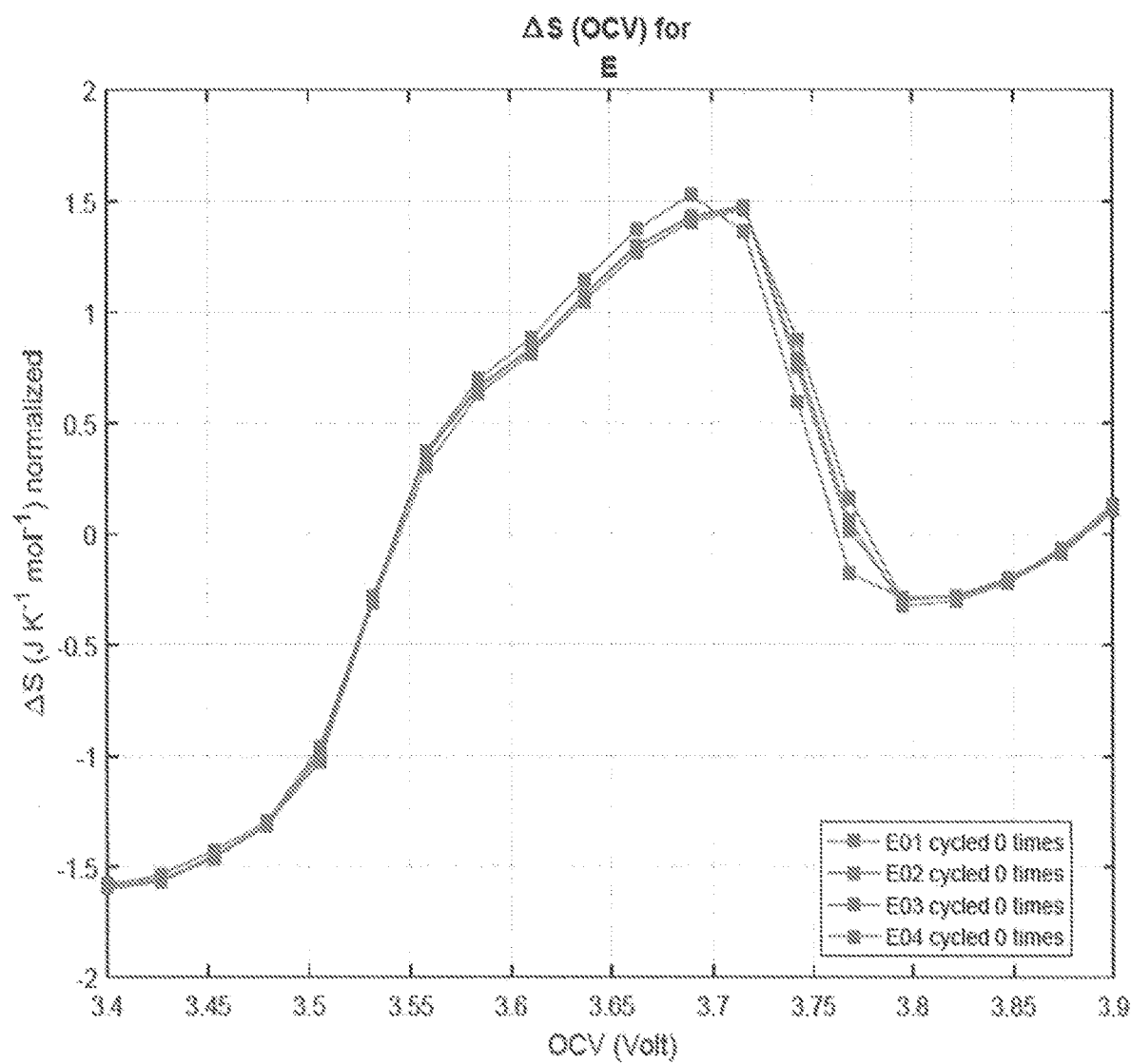
FIG. 6 illustrates ΔS (OCV) profiles for four different batteries from reference E.
Figure 7:
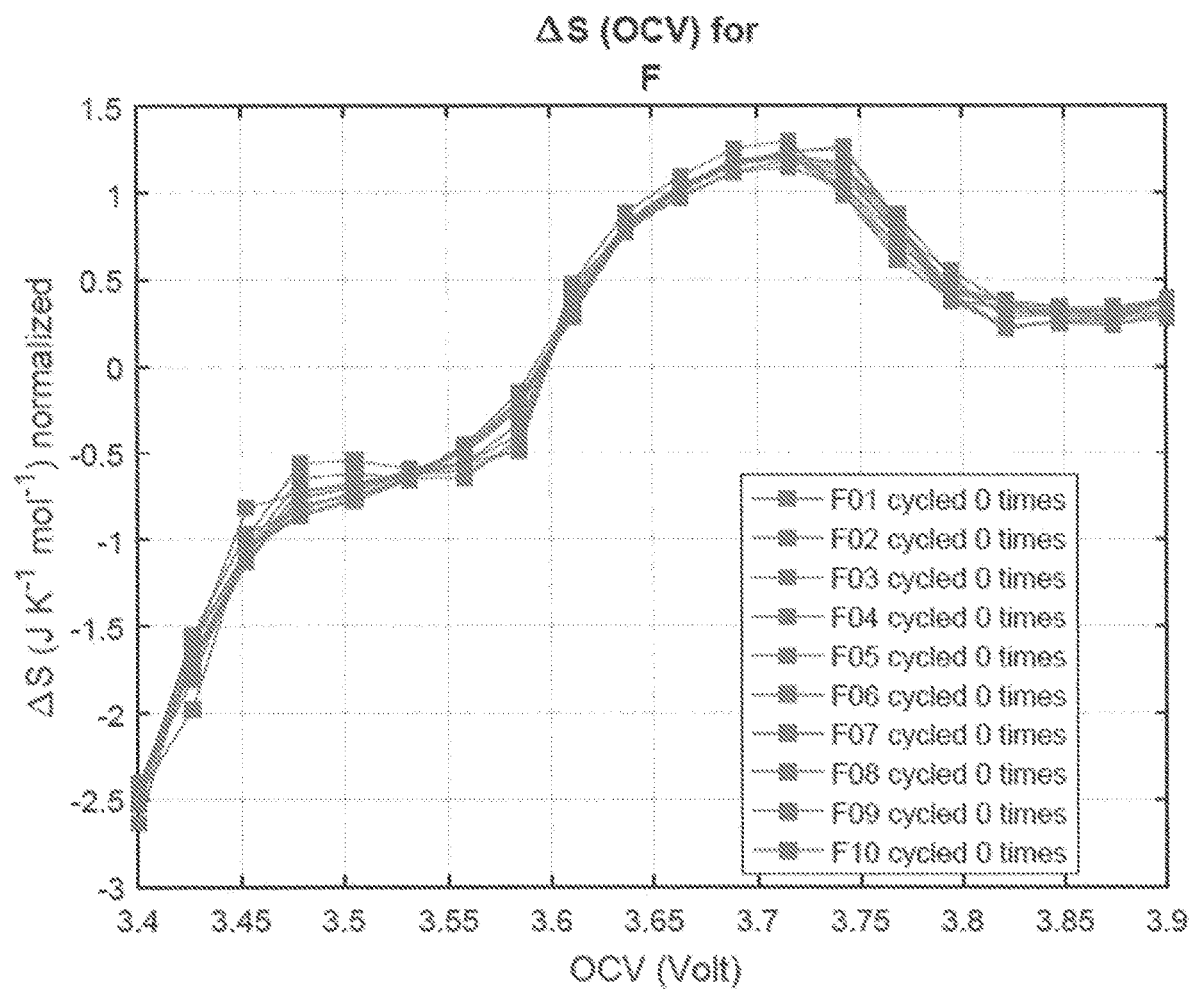
FIG. 7 illustrates ΔS (OCV) profiles for ten different batteries from reference F, FIG. 8 features SOH computed from energy from four batteries of reference A, the batteries being aged until 350 cycles at 55° C. Celsius, and SOH being measured every 50 cycles.
Figure 8:
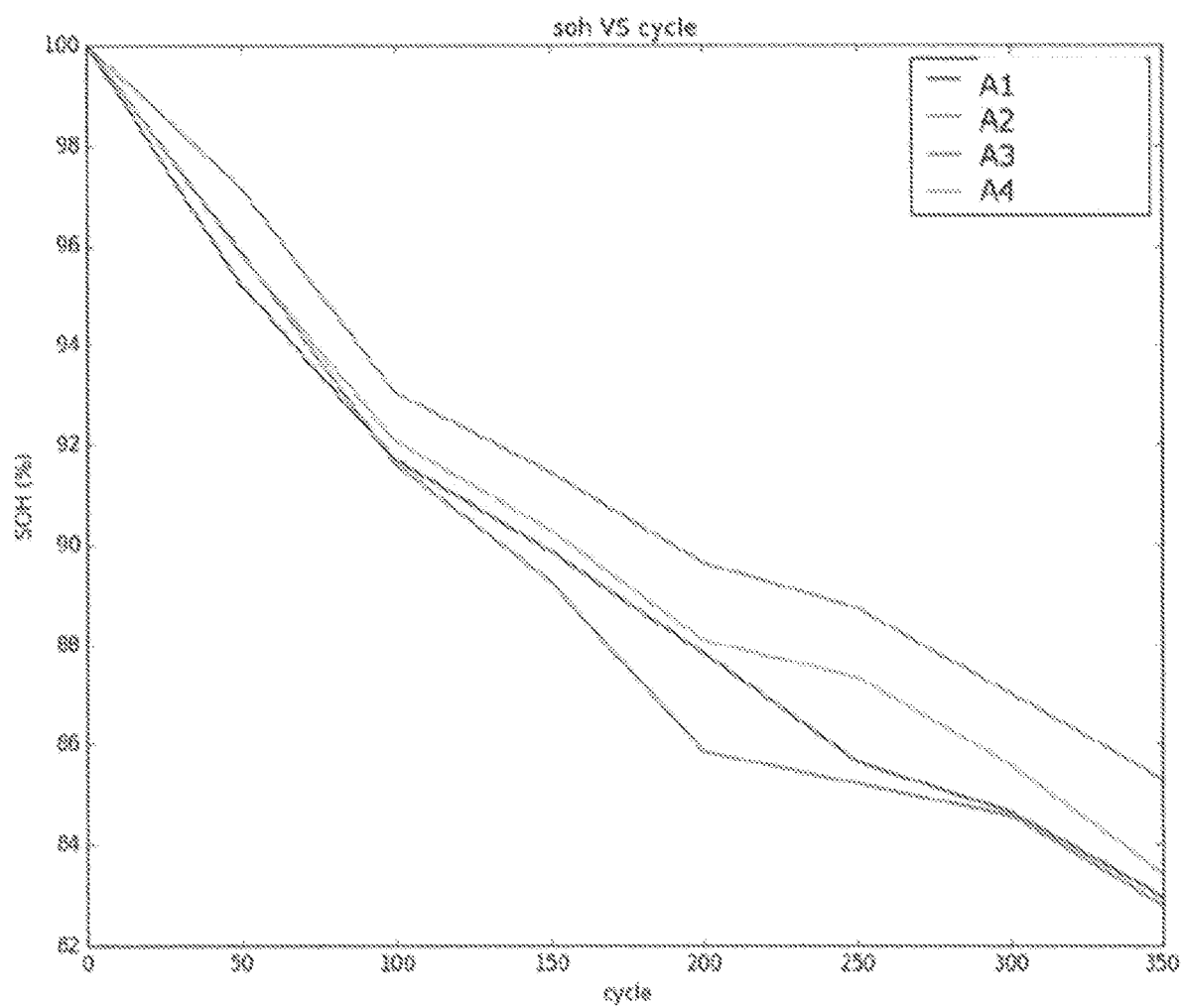
Figure 9:
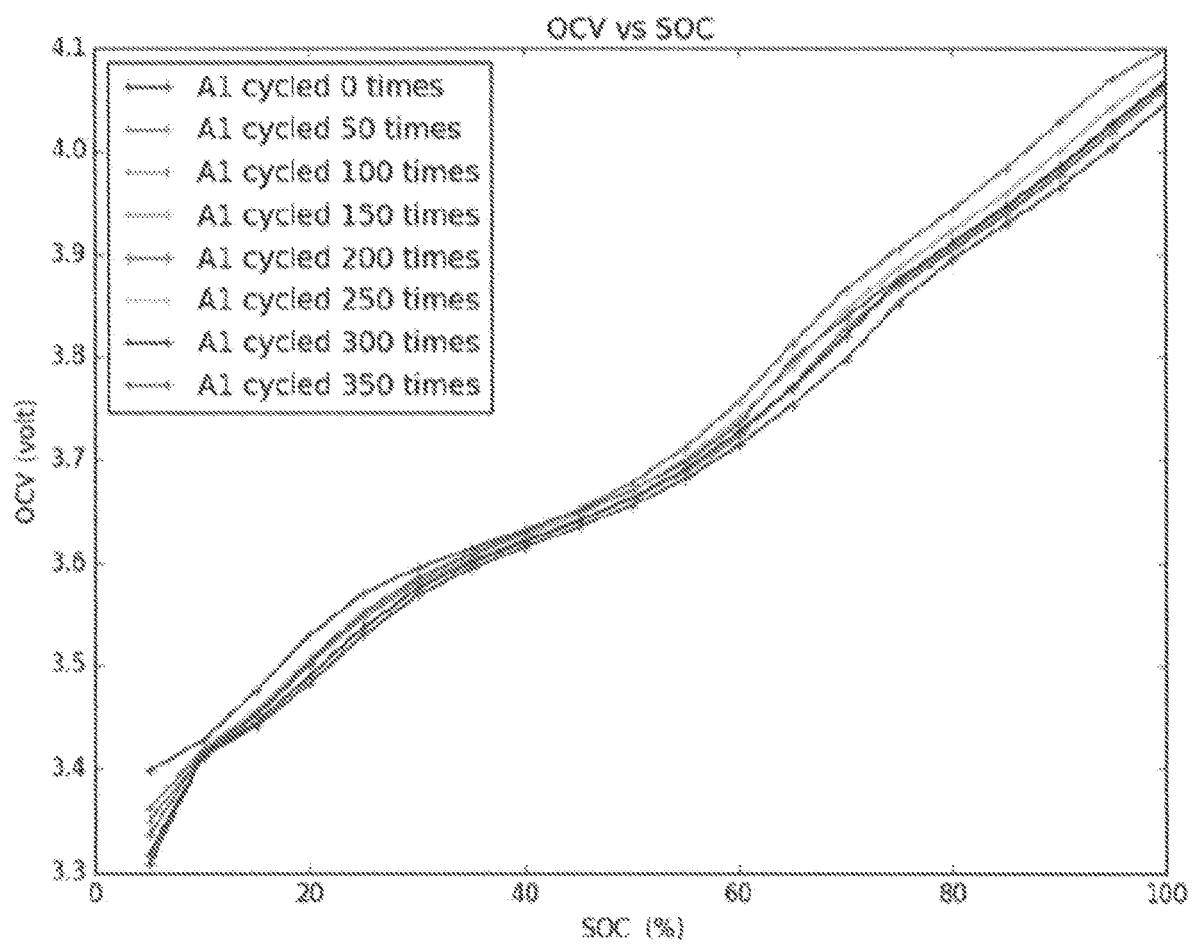
FIG. 9 is an OCV (SOC) plot at different cycles for Battery Al.
Figure 10:
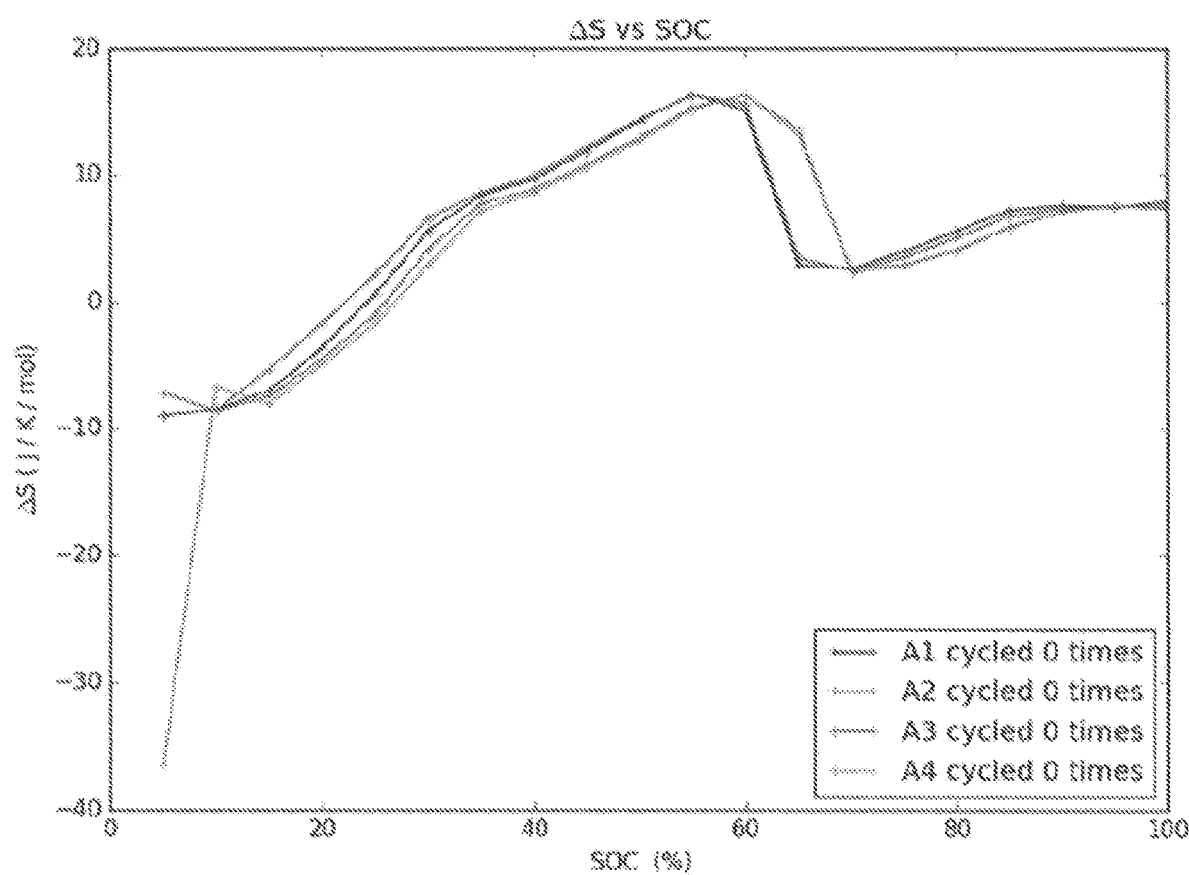
FIG. 10 is a ΔS (SOC) plot for four Batteries from Reference A when fresh.
Figure 11:
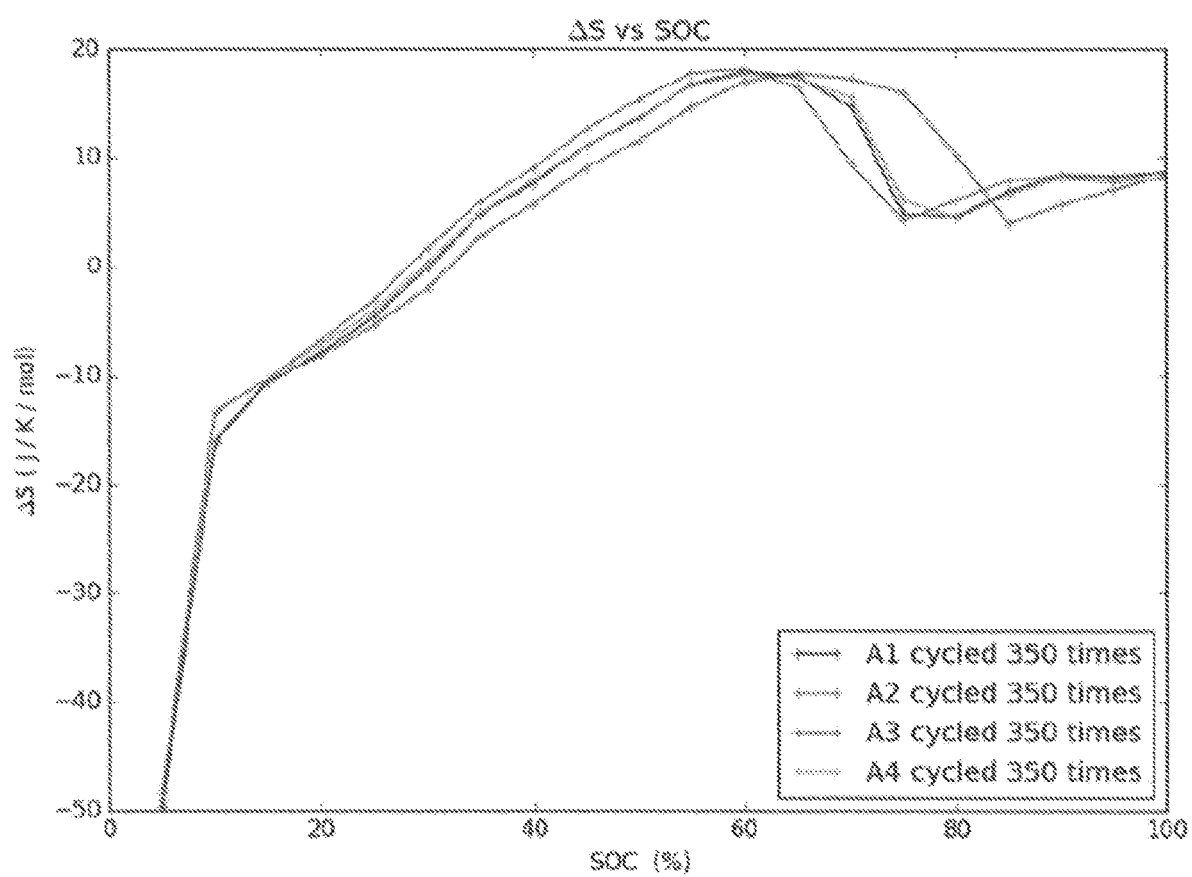
FIG. 11 is a ΔS (SOC) plot for four Batteries from Reference A at 350 cycles.
Figure 12:
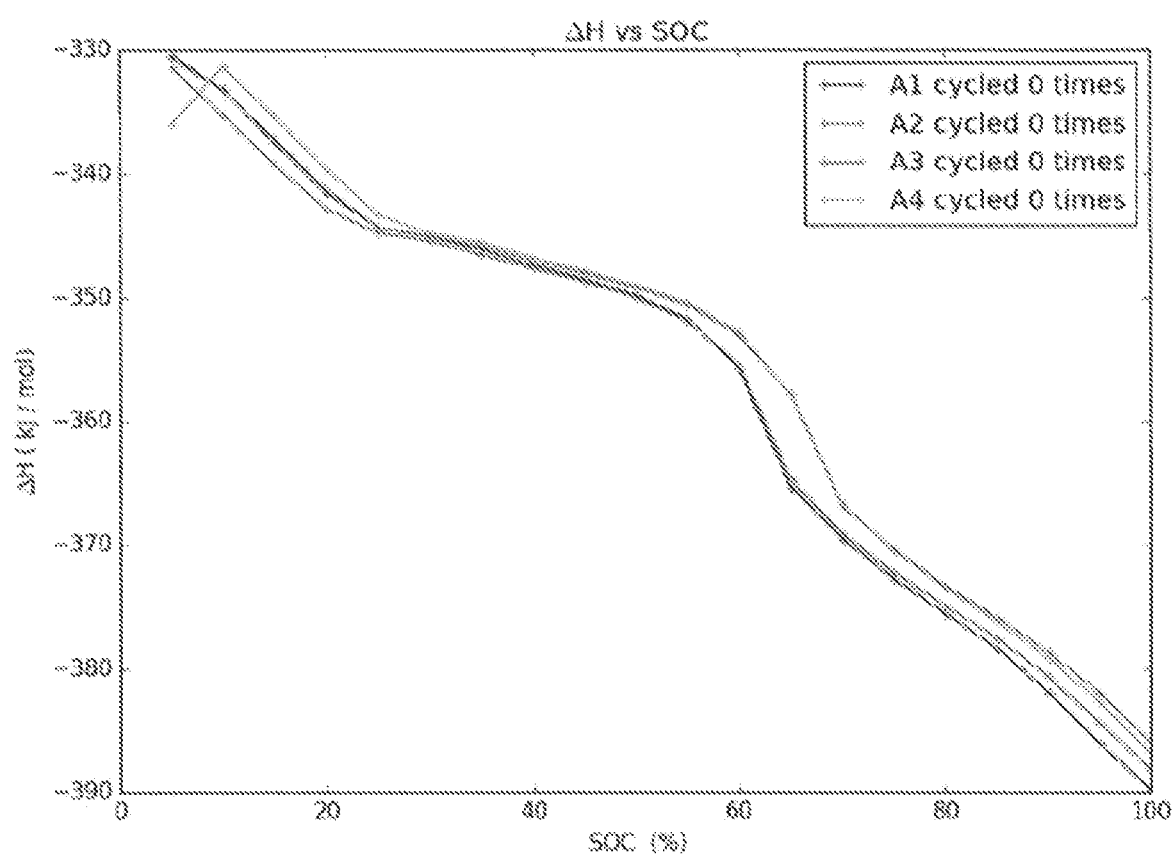
FIG. 12 is a ΔH (SOC) plot for four Batteries from Reference A when fresh.
Figure 13:
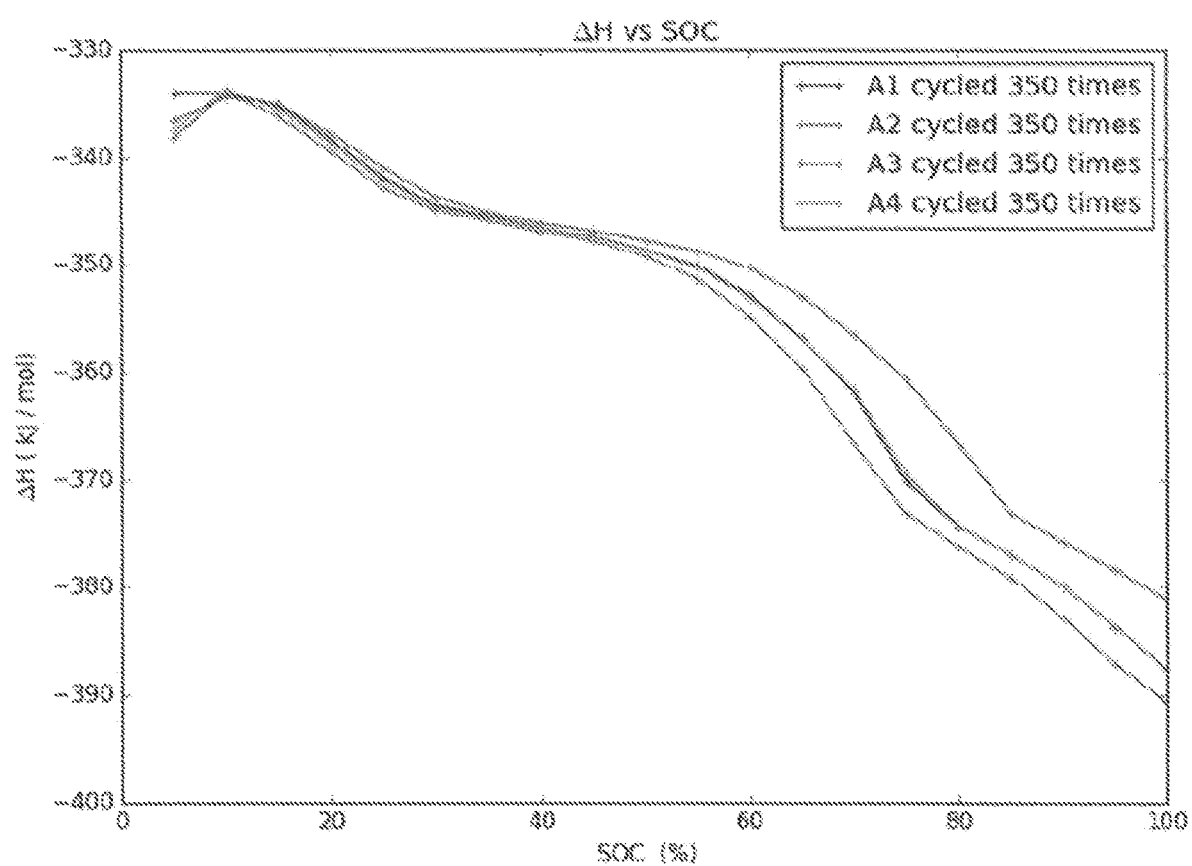
FIG. 13 is a ΔH (SOC) plot for four Batteries from Reference A at 350 cycles.
Figure 14:
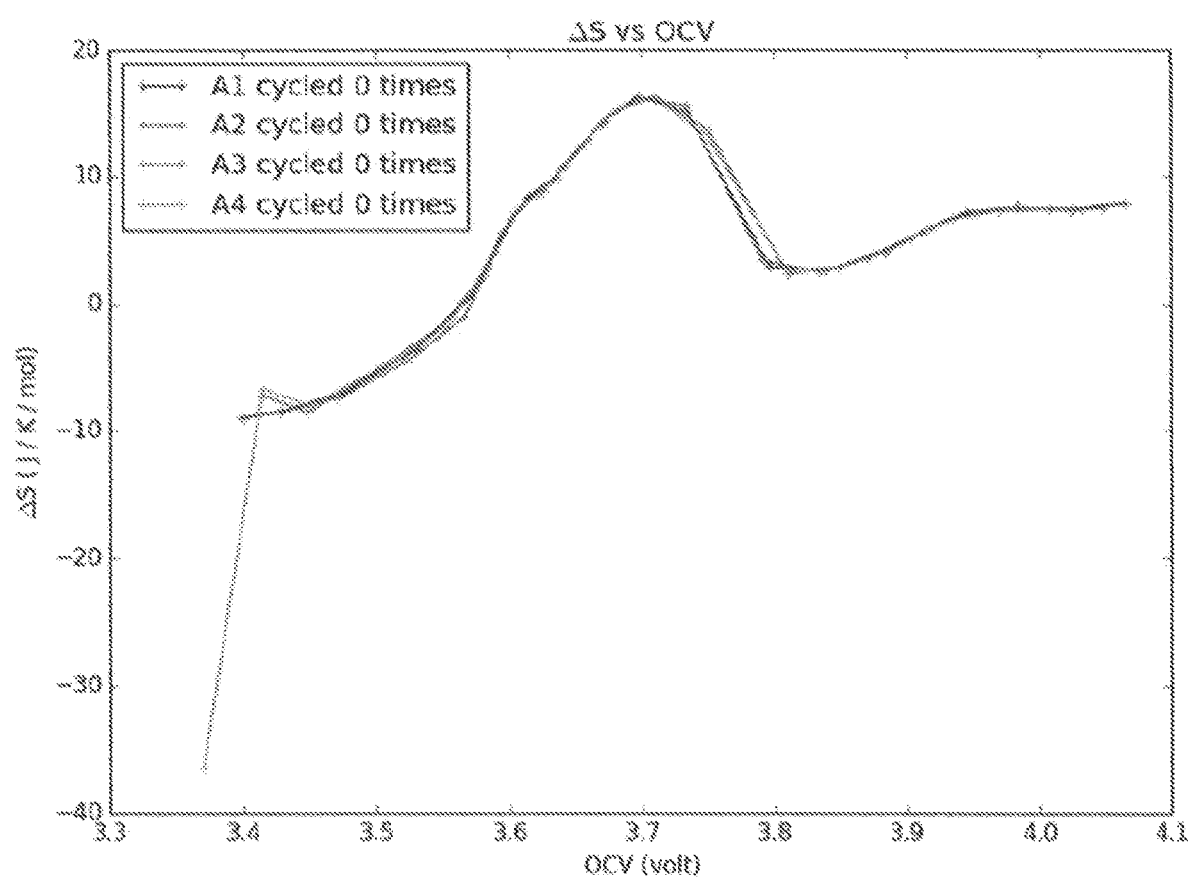
FIG. 14 is a ΔS (OCV) plot for four Batteries from Reference A when fresh.
Figure 15:
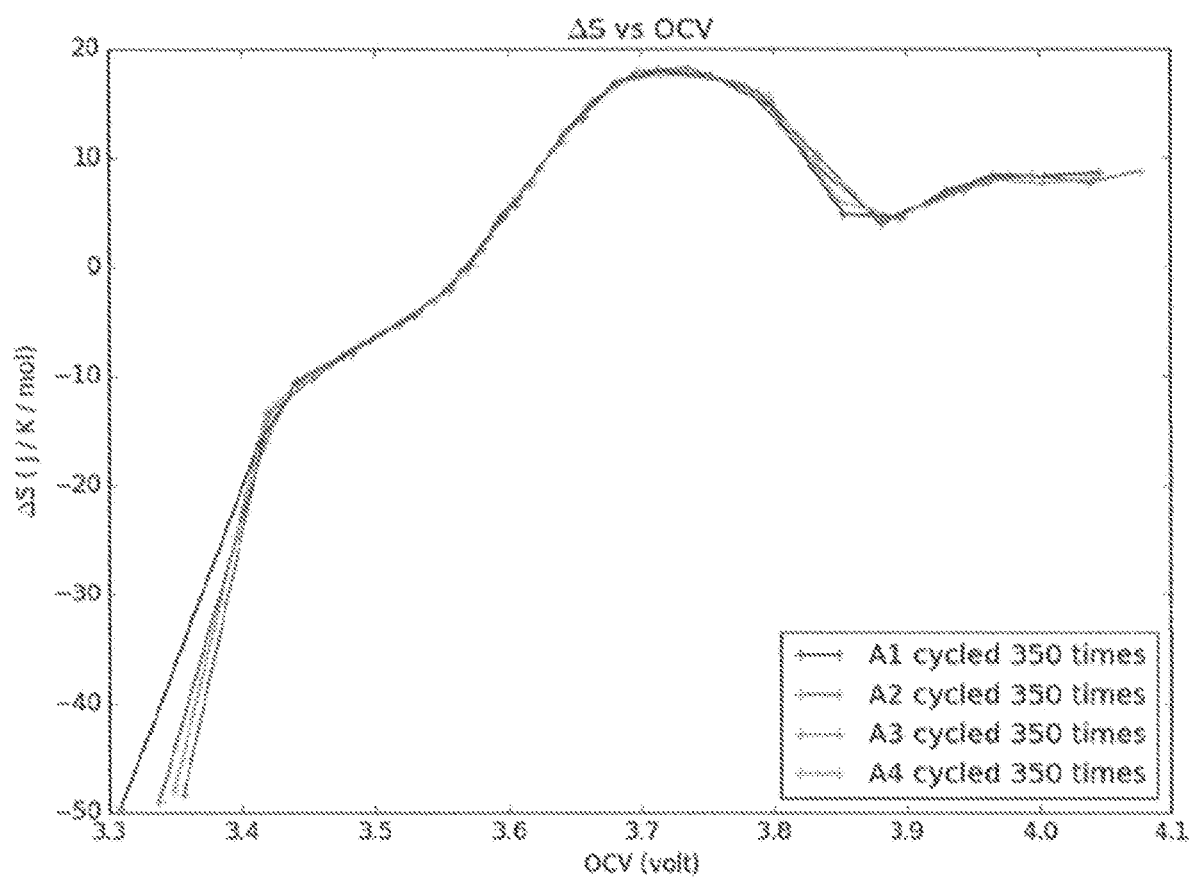
FIG. 15 is a ΔS (OCV) plot for four Batteries from Reference A at 350 cycles.
Figure 16:
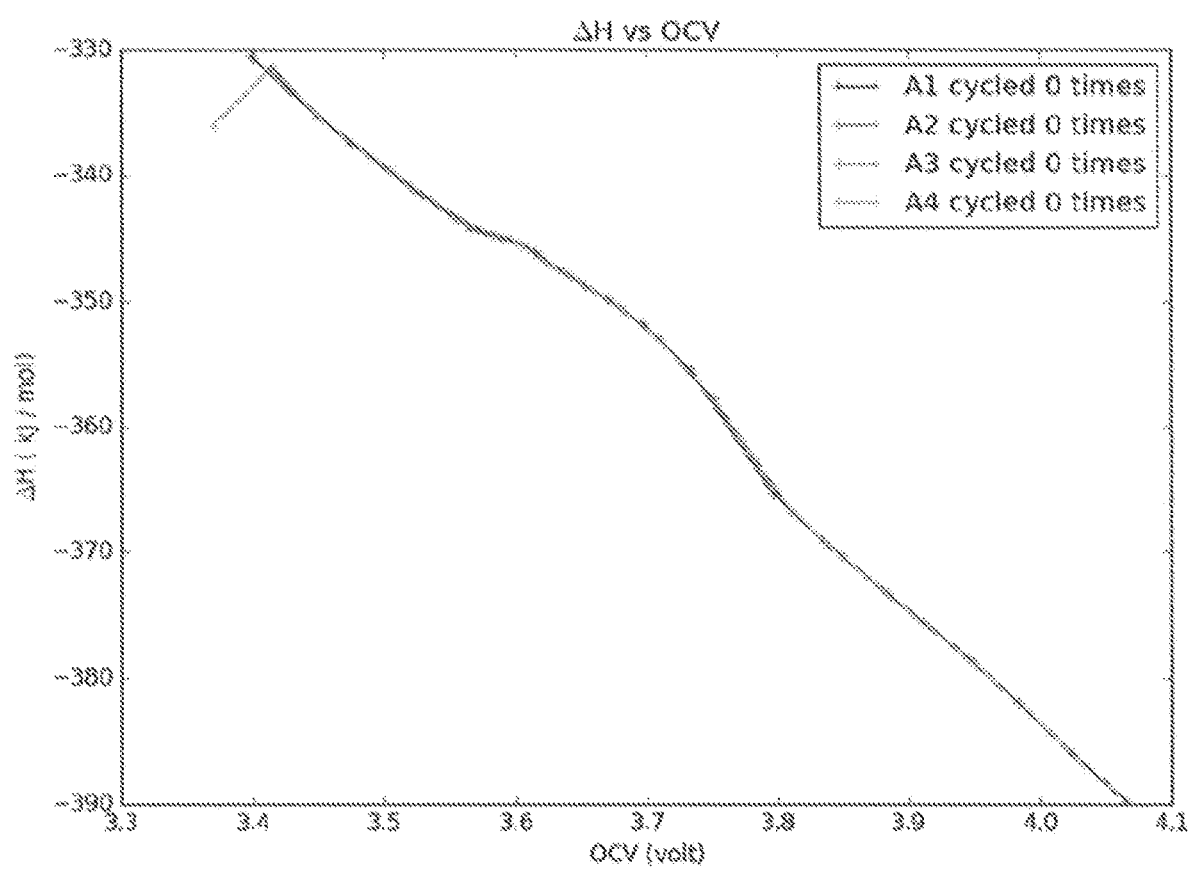
FIG. 16 is a ΔH (OCV) plot for four Batteries from Reference A when fresh.
Figure 17:
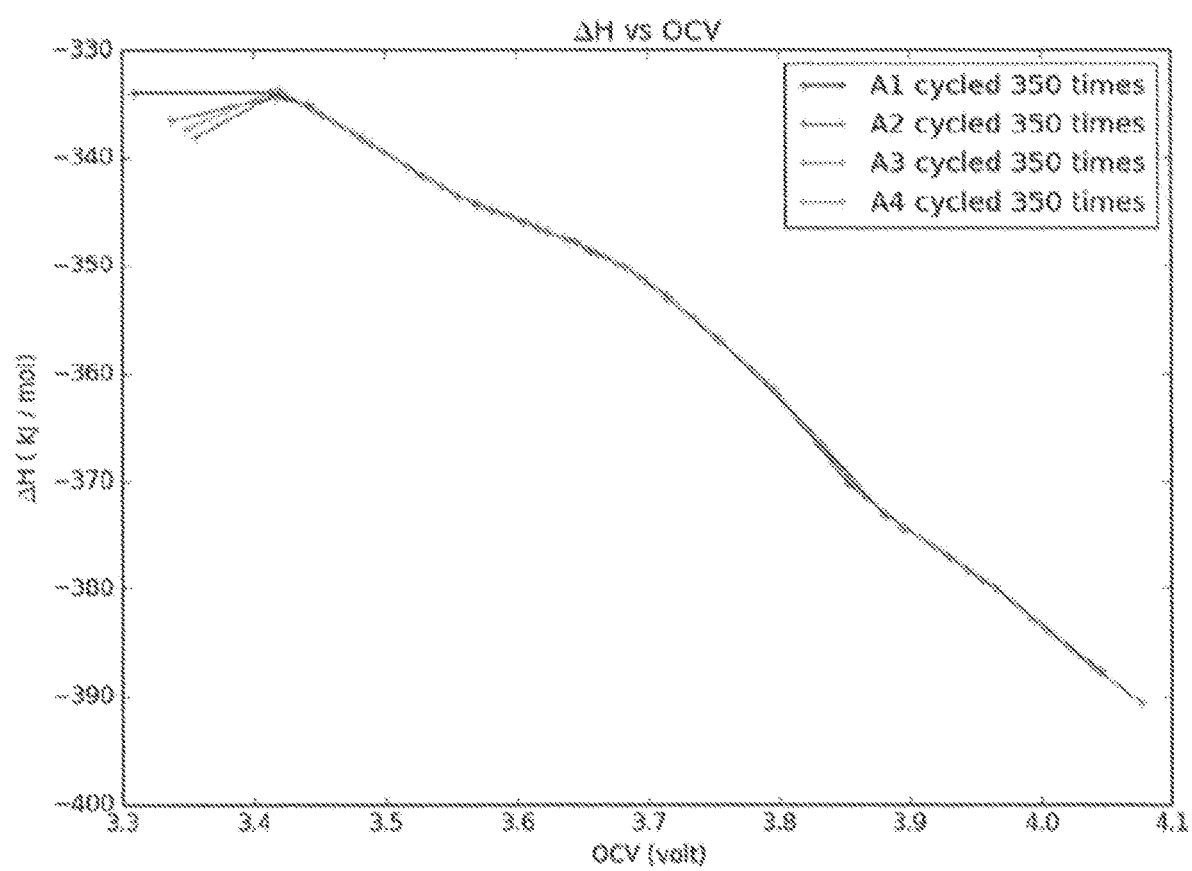
FIG. 17 is a ΔH (OCV) plot for four Batteries from Reference A at 350 cycles.
Figure 18:
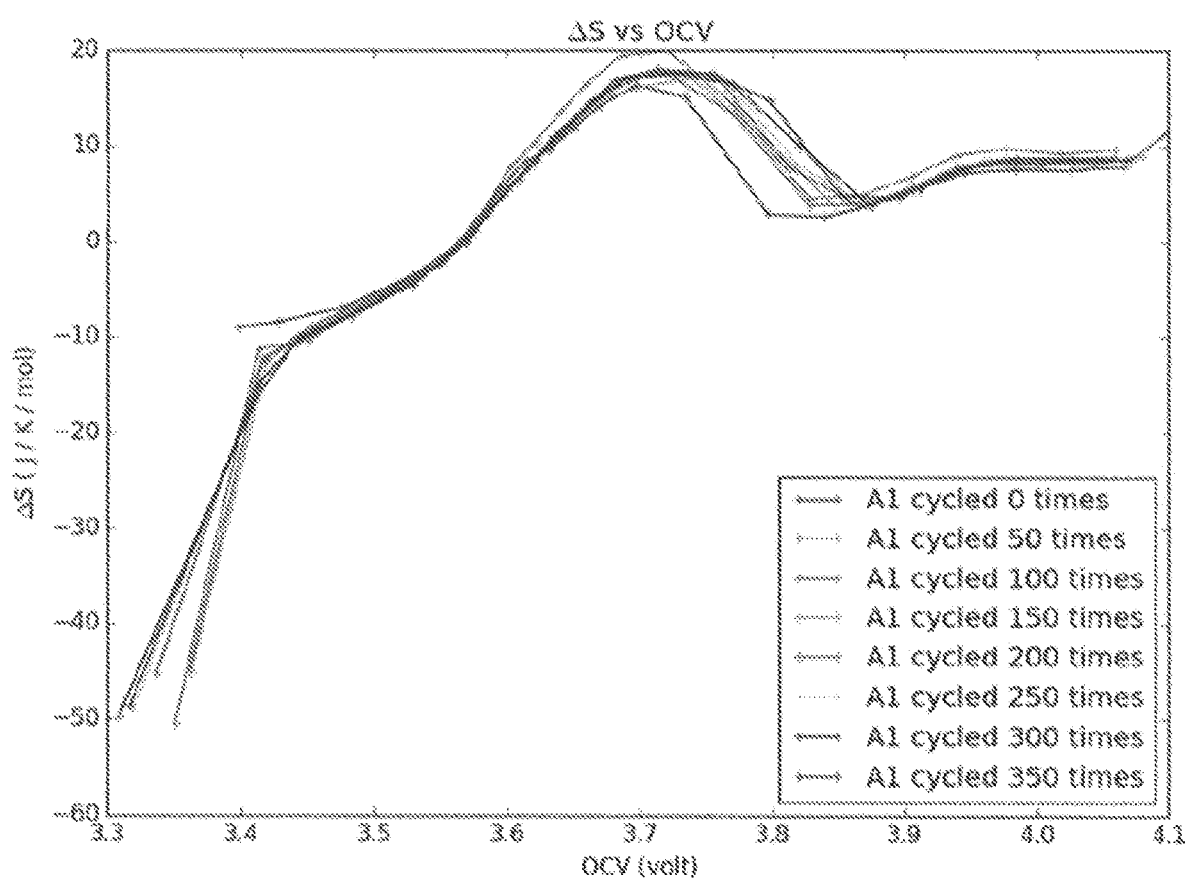
FIG. 18 is a ΔS (OCV) plot for Battery Al.
Figure 19:
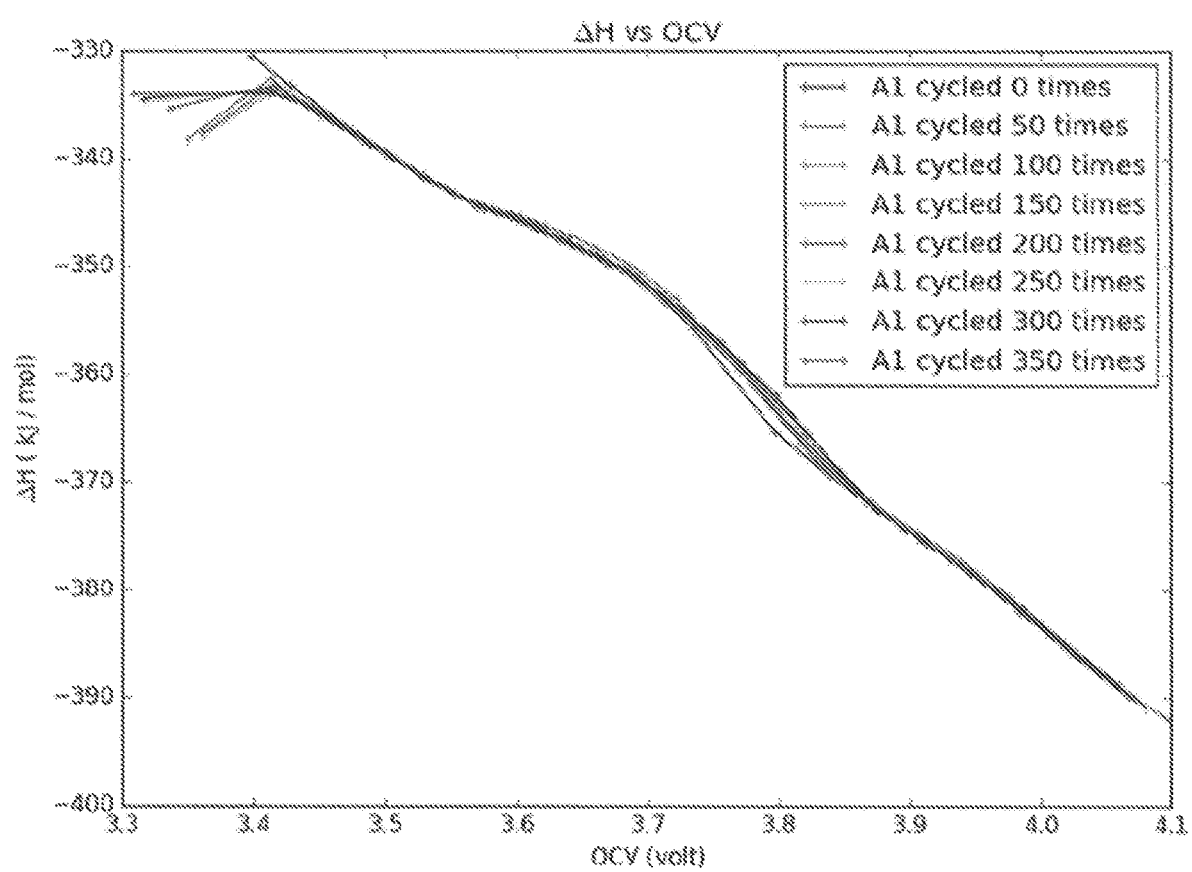
FIG. 19 is a ΔH (OCV) plot for Battery Al.
Figure 20A:
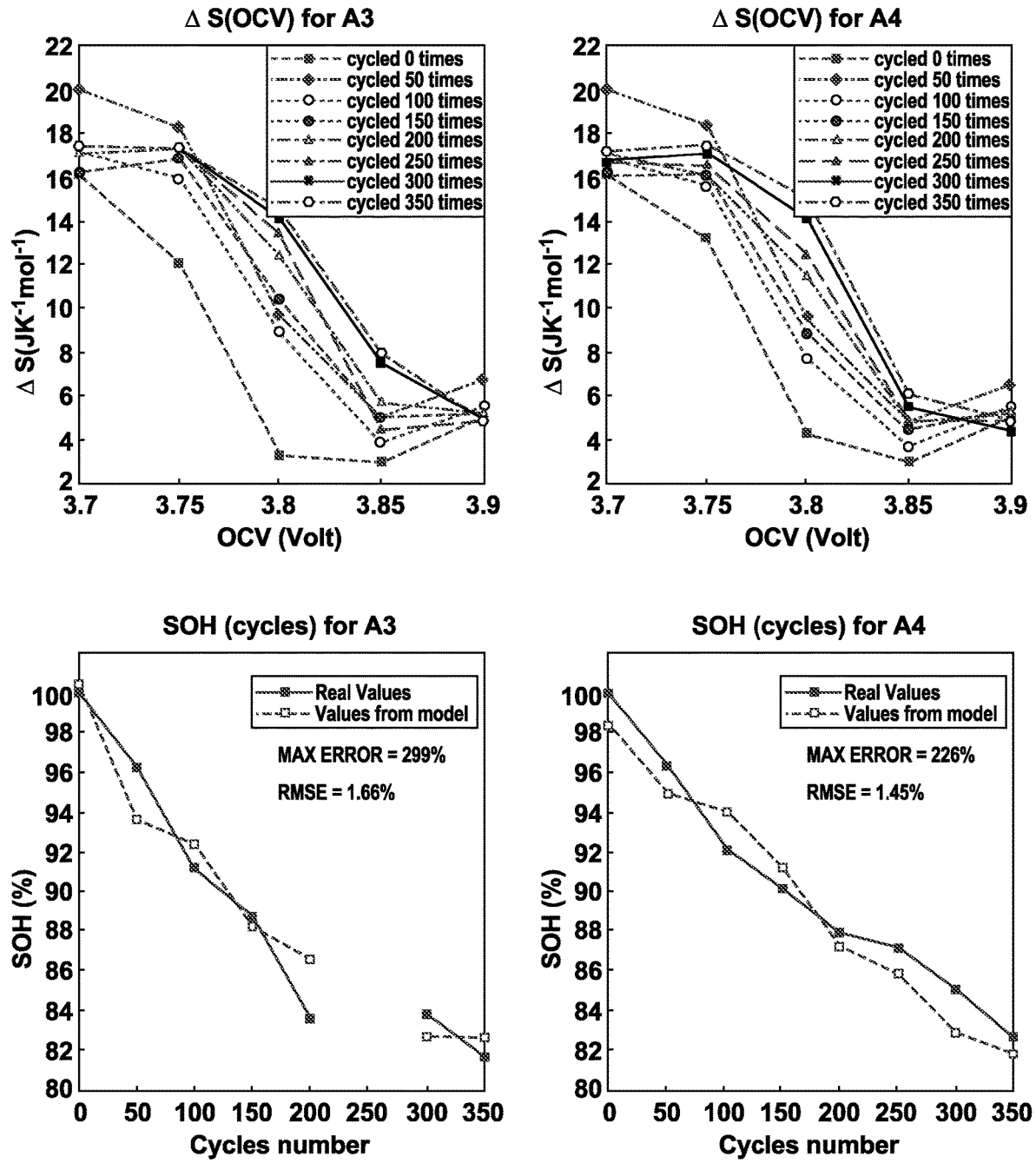
FIGS. 20A, 20B, 21A, 21B, 22A and 22B represent in first row ΔS data between 3.7 and 3.9 volts at different ageing for different batteries, and in second row SOH evolution with ageing, each graph of this row corresponding to a battery.
Figure 20B:
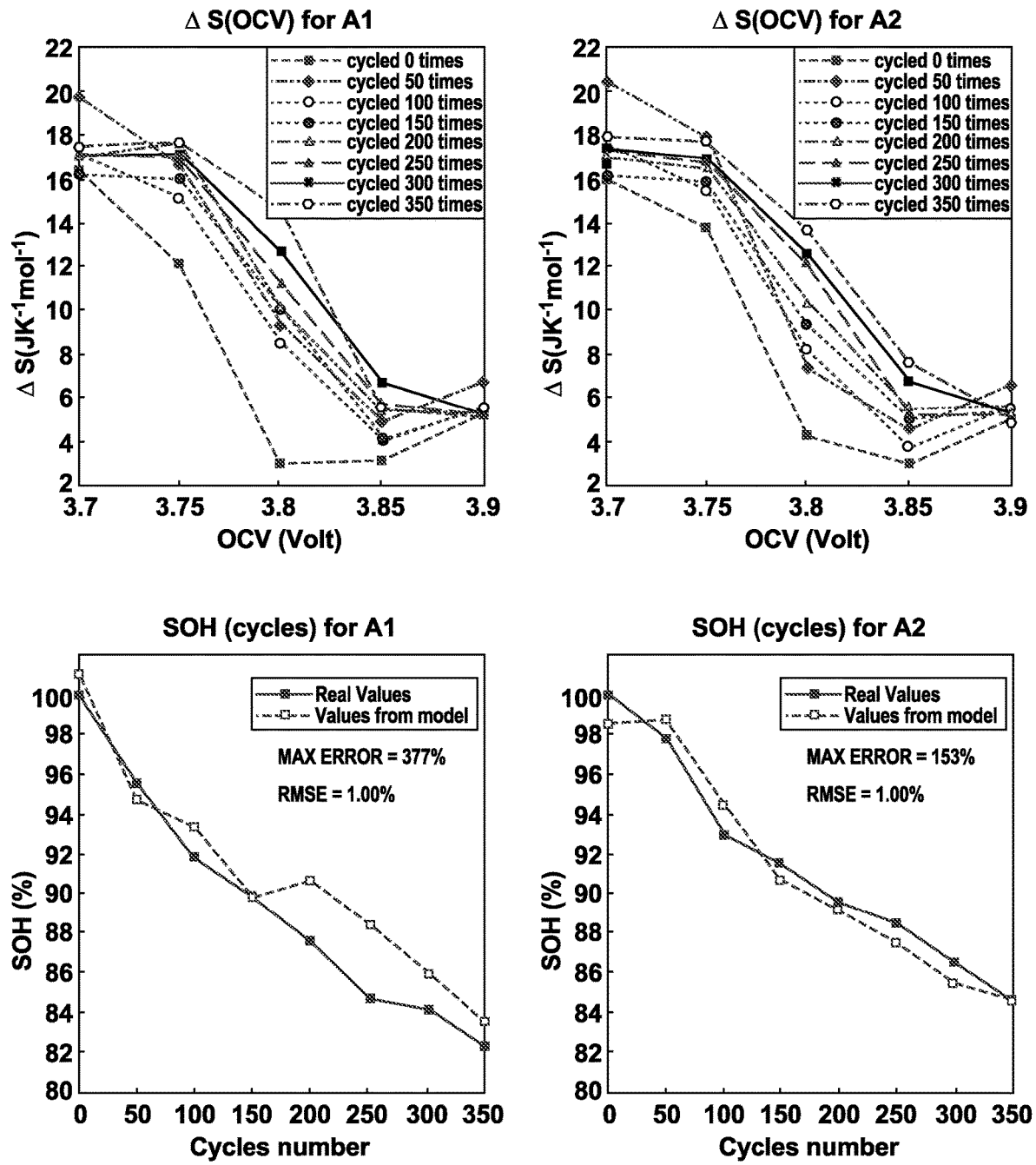

With reference to FIG. 1, a charger system 1 is provided for charging for charging a battery (cell, pack) 2 via an electric connection 3. The charger system 1 implements an Adaptive Control Protocol (ACP) algorithm or a Cascade Pulse Charging (CPC) algorithm 4. The battery 2 is monitored by a measurement system 6 for measuring Voltage, Temperature and Current. From these measurement, Data 6 on Entropy, Enthalpy and Open-Circuit Voltage (OCV) are calculated and then processed by means of SOC, SOH Algorithms to deliver Data 7 on State of Charge (SOC) and State of Health (SOH) of the battery 2. SOC and SOH Data 7 are processed by the charger system 1.

Main Methods of SOH Estimation

According to Reference [1] below, SOH methods estimation can be done with two different approaches, experimental or adaptive one.

With the experimental approach, cycling data is stored. Then previous knowledge of the operation performance of the cell or battery is used to estimate the SOH.

With the adaptive method, calculation of parameters sensitive to the cell degradation is used to estimate the SOH. Each of these approaches has advantages and drawbacks.

One experimental technique for SOH estimation is the direct measurement of internal resistance of the cell/battery (see References [2] [3] [4] [5] [6] [7] below). Indeed, these measurements evaluate the resistance degradation during the testing.

Another well-known experimental technique is the impedance measurement. To estimate it, Electrochemical Impedance Spectroscopy (EIS) is performed. This method is used, for instance, in References [8] [9] [10] [11] [12] [13] [14] [15] [16] [17] below.

Indeed, since battery impedance is increasing with ageing, SOH estimation can be done through it. Moreover, the impedance at different frequency ranges gives information on different dynamics of the battery. So a lot of information can be extracted from the impedance. However, this methodology is not universal for all battery type. The cost and complexity of using it is then very high.

Another very popular experimental technic is the coulomb counting (see Reference [18] below). This method is indeed very simple. During charging and discharging the number of Ah is counted. This way transferred amount of Ah is tracked. Remain capacity is then known. Using voltage data, remained energy can also be computed. Even though it is very used, this methodology is not very accurate.

Concerning the adaptive method, an equivalent circuit is necessary. The goal is then to estimate parameters of the model that are linked to the SOH.

The first adaptive method mentioned here is the Kalman filter for the SOH estimation (see Reference [19] below). Several measurements are done over time to estimate the output variables that tend to be more precise. This method can be run online and is very accurate. However, the computational cost is pretty high.

Another adaptive method that can be mentioned is the extended Kalman filter (see References [20] [21] [22] below). This is the Kalman filter for nonlinear systems, which is usually the case for a battery system.

The approach that is proposed here is different. According to Reference [23] below, there is a link between thermodynamics and battery ageing.

Using the appropriate measurement device, one can calculate the Gibbs free energy, entropy and enthalpy of an electrochemical cell from the temperature dependence of the open circuit voltage (OCV). The measurement is nondestructive.

By looking at these thermodynamic properties, it is possible to quantify the effect of ageing. The ageing effect on electrochemical cell thermodynamics is also shown in References [24] [25] [26] [27] below.

Following is shown how to calculate the thermodynamics properties of the electrochemical cell from the temperature dependence of the OCV.

By definition, the Gibbs Energy, $\Delta G=-nFET$, where n is the ionic charge, F is the Faraday constant, and EG is the open circuit voltage. $\Delta G$ is equal to $\Delta H-T \Delta S$. By measuring the temperature dependence of Ei at a fixed state of charge, the entropy can be calculated from the slope and the enthalpy calculated from the absolute zero temperature intercept: $\Delta S=nF\ GU/GT$; $\Delta H=-nFET+nFT\ GU/GT$ or $\Delta H=-nFET$ when extrapolated to $T=0$.

What is proposed here is to quantitatively establish the relation between thermodynamic properties of an electrochemical cell and SOH.

EXPERIMENTAL

Table 1 lists the batteries used for the study. Cells with the same letter in the name have the same reference and energy are measured at C/10 rate.

TABLE 1

Batteries used for ageing

| Name | Type | Capacity (mAh) | Cathode chemistry |
|---|---|---|---|
| A1 | 18650 | 3200 | $Li_{0.879}Ni_{0.769}Mn_{0.111}Co_{0.119}O_2$ |
| A2 | 18650 | 3200 | $Li_{0.879}Ni_{0.769}Mn_{0.111}Co_{0.119}O_2$ |
| A3 | 18650 | 3200 | $Li_{0.879}Ni_{0.769}Mn_{0.111}Co_{0.119}O_2$ |
| A4 | 18650 | 3200 | $Li_{0.879}Ni_{0.769}Mn_{0.111}Co_{0.119}O_2$ |

Thermodynamic properties measurement is then performed with the BA 2000 from KVI.

Cells are then placed in an environmental chamber at 55° C. Celsius and cycled at 1.5 C rate 50 times. They are then removed from the environmental chamber. Capacity, energy and thermodynamic properties are measured again. This process is repeated again until 350 cycles. At the end of the testing there are SOH and thermodynamic properties of the cells every 50 cycles from 0 to 350 cycles. 55° C. Celsius was chosen to accelerate the ageing process by a factor 8 compared to ambient temperature.

The SOH indicator used to compare it with the thermodynamic properties of the cell is defined as following:

$$SOH = \frac{En_{max}}{En_{nominal}} \cdot 100\%$$

Enmax is the maximum available energy and Ennominai is the measured energy. The cell energy is computed as following:

$$En = \int U \cdot Idt$$

The energy of battery is computed from discharge curve of the cell. In this case, discharge is done at C/10 rate. For example, for an electrical vehicle a battery is considered dead if the SOH value is below 80%.

Knowing that SOH has an effect on thermodynamic properties of the cell, the idea is to fetch thermodynamic data to quantitatively establish a relation between them, the SOH and thermodynamics data.

Thermodynamic data can be plotted in different ways, as illustrated by the plots in FIGS. 1-27:
 OCV (Open circuit voltage) vs SOC (State of charge)
 $\Delta S$ (SOC)
 $\Delta H$ (SOC)
 $\Delta S$ (OCV)
 $\Delta H$ (OCV)
 $\Delta S$ ($\Delta H$)
 SOC ($\Delta S$, $\Delta H$)

The purpose of these plots is to show the reproducibility of the results for different cells from the same reference. It shows that for a given cell it is difficult to use OCV to determine the ageing level and subsequently the SOH. Coulomb counting to determine SOC is probably not well computed because probably of bad connections between the cells and the measurement device.

SOH Estimation Methodology

Reference Identification

Before estimating the SOH, a prior operation has to be carried. Indeed the relationship between Thermodynamics profiles and SOH is different from a reference to another. So the first step is to identify the battery reference.

It has been said that Thermodynamics profiles are also shaped by the battery chemistry; it is then expected to recognize a battery reference from their fingerprints.

To do so, a large amount of thermodynamic profiles from different battery has been collected. The dataset has 126 $\Delta S$ profiles from 6 battery references. Following is a description of the measured profiles:
 Reference A: 38 $\Delta S$ profiles from 10 different batteries at different SOH (represented in FIG. 2)
 Reference B: 37 $\Delta S$ profiles from 9 different batteries at different SOH (represented in FIG. 3)
 Reference C: 9 $\Delta S$ profiles from 9 different batteries at fresh state (represented in FIG. 4)
 Reference D: 28 $\Delta S$ profiles from 8 different batteries at different SOH (represented in FIG. 5)
 Reference E: 4 $\Delta S$ profiles from 4 different batteries at fresh state (represented in FIG. 6)
 Reference F: 10 $\Delta S$ profiles from 10 different batteries at fresh state (represented in FIG. 7)

Once the data collected and normalized (represented in FIG. 8), pattern recognition algorithms are used to classify the profiles. Different algorithms are used 22 are tested and compared.

To evaluate the accuracy of the different algorithms a cross validation is carried.

The different algorithms learn on 75% of data and they are been asked to classify the 25% remaining.

By looking at the results shown in FIG. 28, the conclusion is that by using pattern recognition algorithms, it is possible to recognize a battery reference by its entropy profiles.

For example, SVM (Support vector machine) performs a perfect classification with the samples. Some algorithms can also provide a confidence on the classification.

Once the battery is identified, it is time to estimate the SOH. Of course this step is not needed if it is already known.

SOH determination methodology diagram

This diagram explains the process in order to estimate battery SOH from thermodynamic data. The process is based on two main tasks: learning and estimating. The tool using this process is called entropy revealer.

To learn, entropy revealer has to fill and update a database as well as to generate models. This happens when thermodynamics data and information on the battery is already known, such as reference, chemistry or SOH.

To estimate SOH from thermodynamic data, entropy revealer will first identify the battery type if not known already. This is done thanks to the database and machine learning models. Once known, SOH is estimated with previously found machine learning models.

SOH Estimation
SOH Estimation from ΔS

The strategy is going to be similar at the one used previously for identification. Pattern recognition algorithms will be used to estimate SOH. The model will learn and then estimate SOH.

The difference is that instead of identifying a reference, an SOH value is going to be estimated from ΔS profiles. To illustrate this, a battery reference is chosen: batteries labeled with the letter A. For a reference four batteries have been aged in the way described in the experimental section.

First, an OCV region is chosen. For this reference the range [3.7; 3.9] is considered. The reason is that the ΔS profiles vary more significantly with cycling in this area.

Therefore, to train the pattern recognition models, ΔS data in the chosen region are going to be used as input to the model. And SOH data computed from energy are considered for output.

Data used are in Table 2. Data from each battery is in one color. The goal is to link ΔS values at 3.7, 3.75, 3.8, 3.85 and 3.9 Volt to the output SOH.

In one line of Table 2, a model that can predict SOH can be found in the last column. This prediction should be based on the five ΔS values, the first five columns.

The model found has to work for all the lines of Table 2.

The simplest model is the multiple linear one. In this case, it can be written this way:

$$\widetilde{SOH} = a_1 * \Delta S(3.7) + a_2 \Delta S(3.75) + a_3 * \Delta S(3.8) + a_4 * \Delta S(3.85) + a_5 * \Delta S(3.9) + c$$

It is then needed to find the six parameters to get the model ($a_1$, $a_2$, $a_3$, $a_4$, $a_5$ and c) and validate it.

To validate the model a cross-validation is computed. Data are spitted in four sets. Then the pattern recognition algorithm learns with 75% of data and test the resulting model on the remaining 25% of the data.

The parameters found are:

| a1 | a2 | a3 | a4 | a5 | c |
|---|---|---|---|---|---|
| 0.8593 | 0.1299 | 1.5315 | 0.5339 | 0.4448 | 89.1968 |

A prediction can then be done. Line 15, for instance, of table 3 is considered. Parameters found and ΔS values will be used to estimate SOH:

$$\widetilde{SOH} = 0.8593*17.24 + 0.1299*16.93 - 1.5315*12.57 - 0.5339*6.72 + 0.4440*5.30 + 89.2$$

$$\widetilde{SOH} = 85.7$$

The real value is 86.6%. The error in SOH is less than 1% for this estimation. Same can be done with line 18, which correspond to another battery and another ageing:

$$\widetilde{SOH} = 11.8593 = 20.04 + 0.1299*18.27 - 1.5315*9.68 - 0.5339*4.87 + 0.4448*6.78 + 89.2$$

$$\widetilde{SOH} = 94.4\%$$

The real value is 96.2%. The model is still good enough, the difference is 1.8%. When considering multiple linear regressions, results are displayed in FIG. 20. The graphs in the first row represent input data: ΔS (OCV) profiles for the four batteries in the [3.7; 3.9] OCV range.

The graphs in the second row represent the real measured SOH of the four batteries. The estimated ones by multiple linear regressions and cross validation are also represented.

TABLE 3

ΔS values at five OCV and the corresponding SOH

| | ΔS at 3.7 V (J/K/mol) | ΔS at 3.75 V (J/K/mol) | ΔS at 3.8 V (J/K/mol) | ΔS at 3.85 V (J/K/mol) | ΔS at 3.9 V (J/K/mol) | SOH (%) |
|---|---|---|---|---|---|---|
| 1 | 16.2512 | 12.0876 | 2.9175 | 3.0505 | 5.1176 | 100 |
| 2 | 19.6495 | 16.6629 | 9.2703 | 4.8147 | 6.5785 | 95.5806 |
| 3 | 17.0372 | 15.0715 | 8.4591 | 3.9121 | 5.476 | 91.7678 |
| 4 | 16.1039 | 15.848 | 9.9115 | 3.9869 | 5.349 | 89.8614 |
| 5 | 17.007 | 17.5516 | 9.9724 | 5.0274 | 5.1774 | 87.6651 |
| 6 | 17.0293 | 16.8205 | 11.1173 | 5.5732 | 5.11 | 84.687 |
| 7 | 17.1642 | 16.9583 | 12.6148 | 6.6178 | 5.1554 | 84.1361 |
| 8 | 17.4857 | 17.5343 | 14.312 | 5.3294 | 4.9653 | 82.3992 |
| 9 | 15.8957 | 13.6904 | 4.2626 | 2.9626 | 5.0441 | 100 |
| 10 | 20.4008 | 17.7164 | 7.2951 | 4.5617 | 6.5331 | 97.747 |
| 11 | 17.5181 | 15.4227 | 8.1058 | 3.6829 | 5.4391 | 92.8943 |
| 12 | 16.0911 | 15.773 | 9.2852 | 5.0771 | 5.406 | 91.5078 |
| 13 | 16.8859 | 16.4492 | 10.3556 | 5.404 | 5.612 | 89.5123 |
| 14 | 17.3915 | 16.7929 | 12.1482 | 5.1064 | 5.2267 | 88.5441 |
| 15 | 17.2416 | 16.9324 | 12.5677 | 6.721 | 5.3049 | 86.5905 |
| 16 | 17.8504 | 17.6292 | 13.6603 | 7.4829 | 5.17 | 84.7103 |
| 17 | 16.2274 | 12.0563 | 3.2596 | 2.966 | 4.9968 | 100 |
| 18 | 20.0402 | 18.2706 | 9.6853 | 4.8683 | 6.7784 | 96.1938 |
| 19 | 17.0678 | 15.9123 | 8.9438 | 3.7977 | 5.5263 | 91.263 |
| 20 | 16.174 | 16.793 | 10.3973 | 5.0481 | 5.0702 | 88.7543 |
| 21 | 17.1127 | 17.2736 | 12.4167 | 5.7159 | 5.1969 | 83.5842 |
| 22 | 17.3729 | 17.3294 | 14.0527 | 7.624 | 4.926 | 83.8154 |
| 23 | 17.44 | 17.3174 | 14.4978 | 7.9727 | 5.006 | 81.7131 |
| 24 | 15.9723 | 13.1836 | 4.3035 | 2.9873 | 4.9644 | 100 |
| 25 | 19.8993 | 18.9157 | 9.3795 | 4.6881 | 6.5593 | 96.3351 |
| 26 | 17.0725 | 15.6108 | 7.773 | 3.7137 | 5.216 | 92.1466 |
| 27 | 15.9947 | 16.014 | 8.9332 | 4.3633 | 4.955 | 90.2269 |
| 28 | 16.7177 | 16.0324 | 11.518 | 4.5625 | 4.9224 | 88.0199 |
| 29 | 16.6957 | 16.5542 | 12.4441 | 4.6874 | 4.8302 | 87.1979 |
| 30 | 16.8383 | 17.0038 | 14.1708 | 5.4787 | 4.5672 | 85.228 |
| 31 | 17.2307 | 17.4241 | 14.9859 | 6.0525 | 4.8805 | 82.7027 |

The maximum error on the SOH estimation is 3.77% and the average error is 1.57%. It is then reasonable to consider that by using ΔS profiles and machine learning tools, one can estimate SOH with good accuracy in a robust way.

Figure 21A:
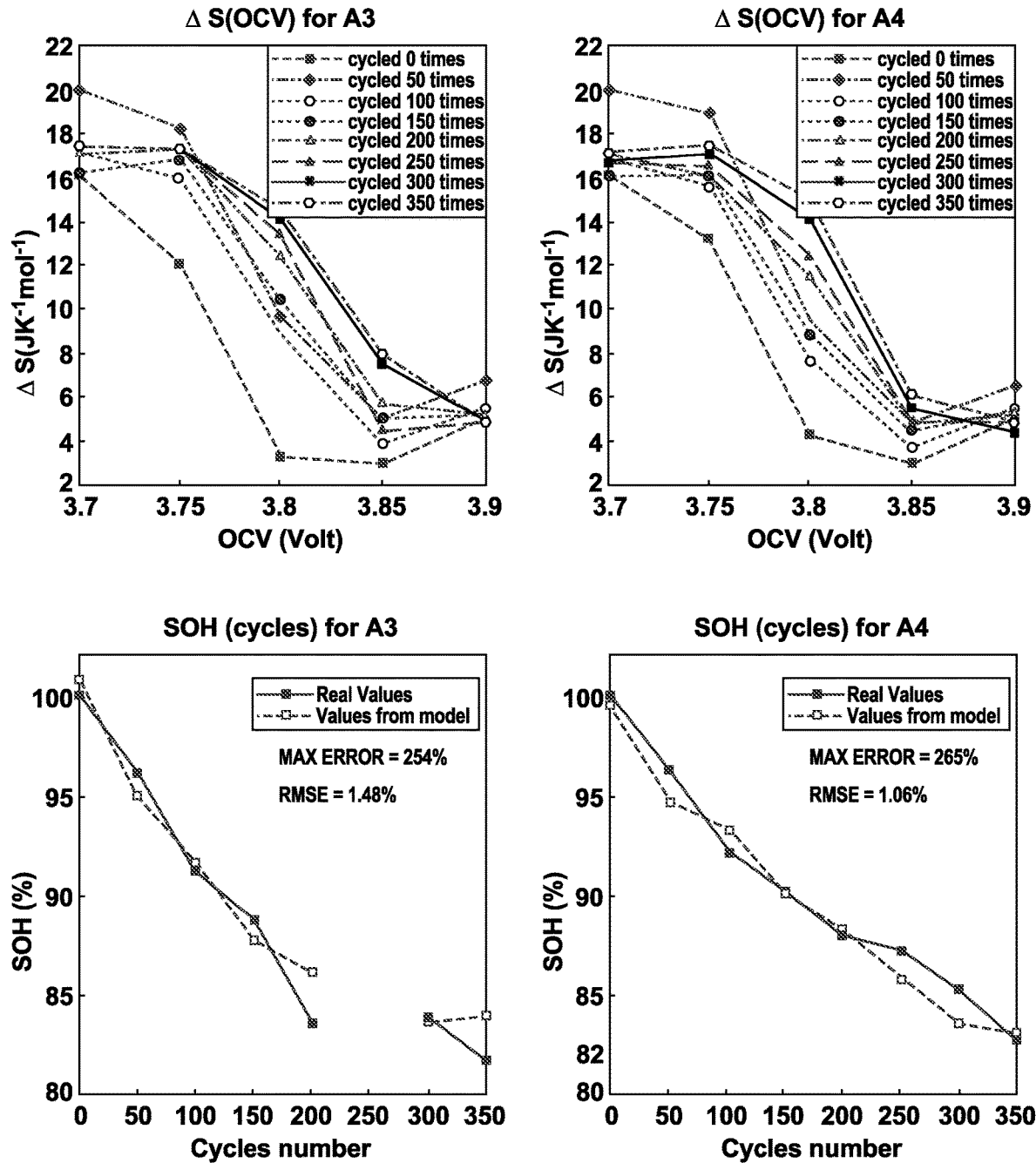
Figure 21B:
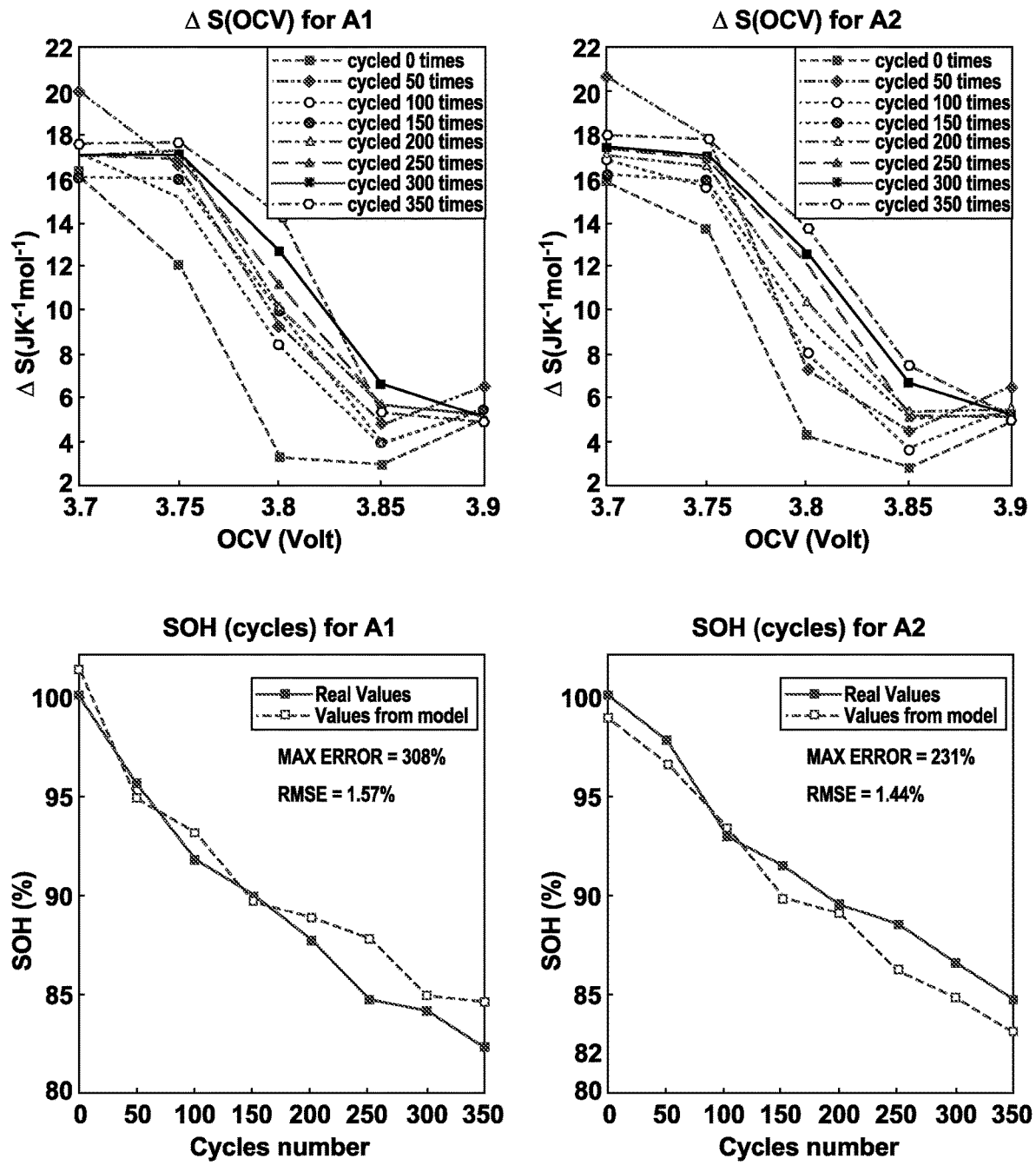
Figure 22A:
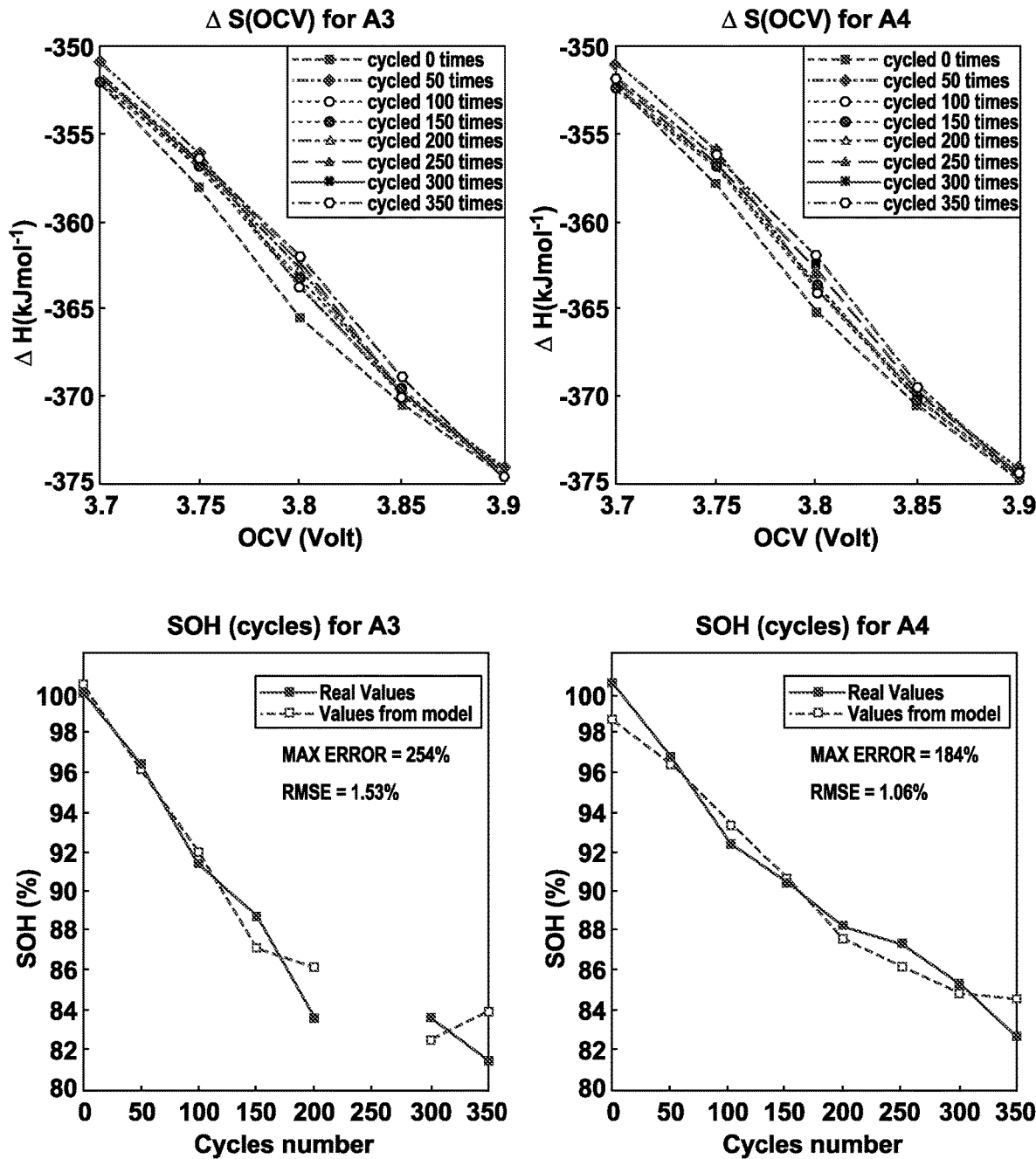
Figure 22B:
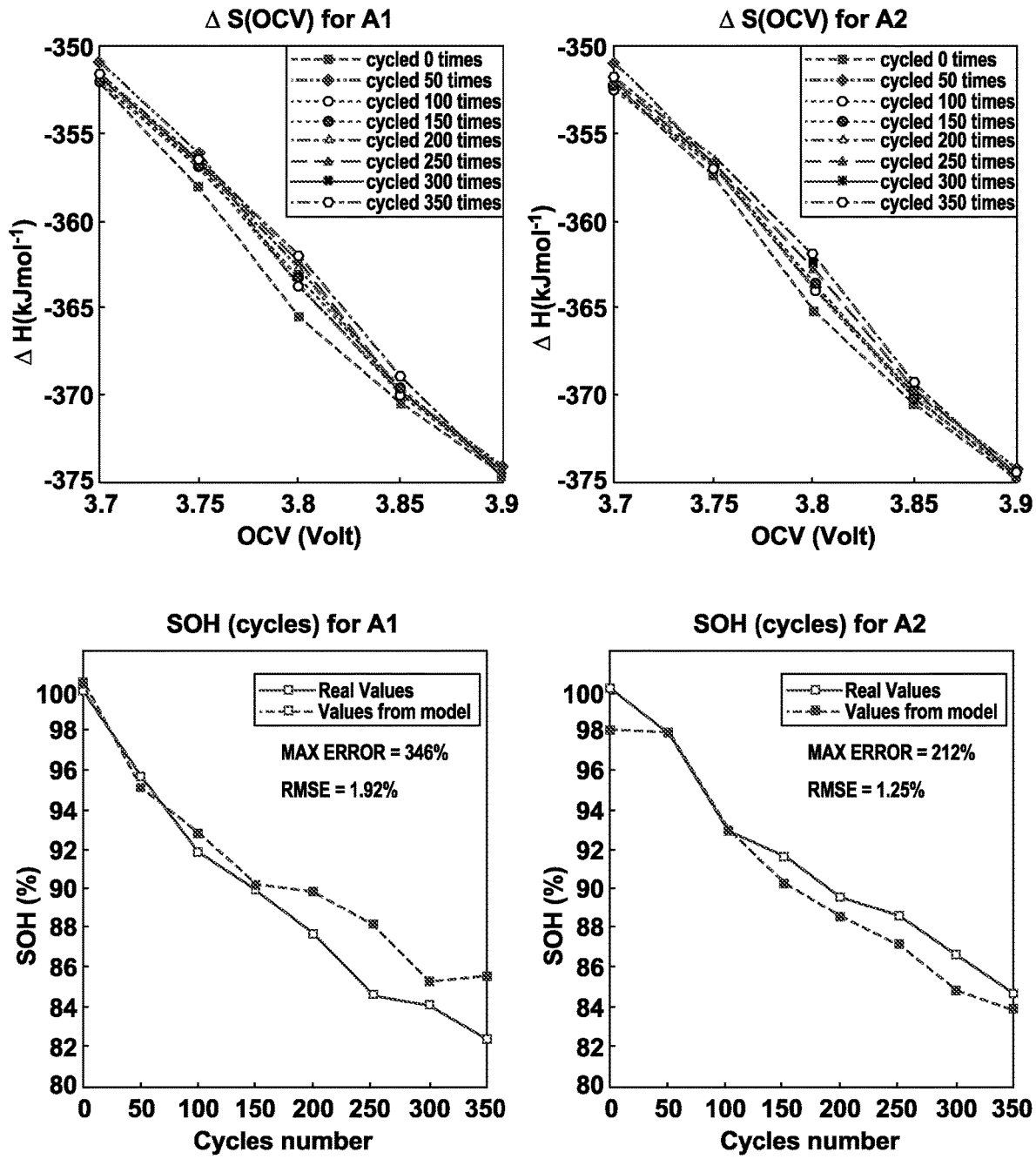
Figure 23:
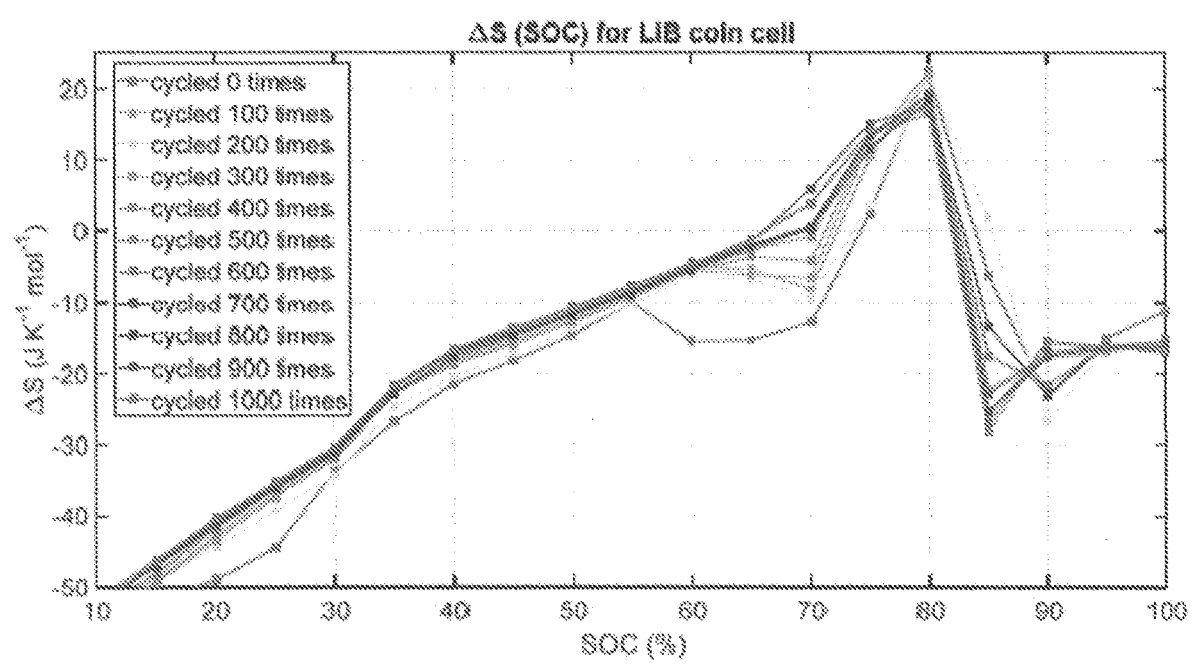
FIGS. 23-24 are ΔS (SOC) profiles at different ageing for a LIB coin cell.

To reinforce this idea, Gaussian process regression is also tested. It gives another model with a different relationship between ΔS and SOH, but the principle is the same. It is a more complex model. Results are represented in FIG. 21.

The maximum error is 3.08% and the average error is 1.33%. This model gives even better accuracy, however the complexity is increased.

SOH estimation from ΔH

So far, only entropy variation profiles have been used. However it is also possible to estimate SOH from enthalpy variation profiles.

Same as for ΔS has been done for DH in the same OCV region. Findings are that higher complex model is needed to estimate SOH compared to ΔS.

Multiple linear regressions don't work well, so results are not presented here.

Gaussian process regression performs good results. According to FIG. 22 the maximum error is 3.46% and the average error is 1.48%. Results, which are comparable to SOH estimated from ΔS with Gaussian process regression.

SOH estimation for another chemistry

To reinforce the idea of universality of the methodology, this latter has been applied to another dataset. Cycling data of a 44 mAh Lib coin cell is available until 1000 cycles. The cell was cycled at C/2 rate at ambient temperature. Thermodynamic data and Energy are measured every 100 cycles.

Figure 24:
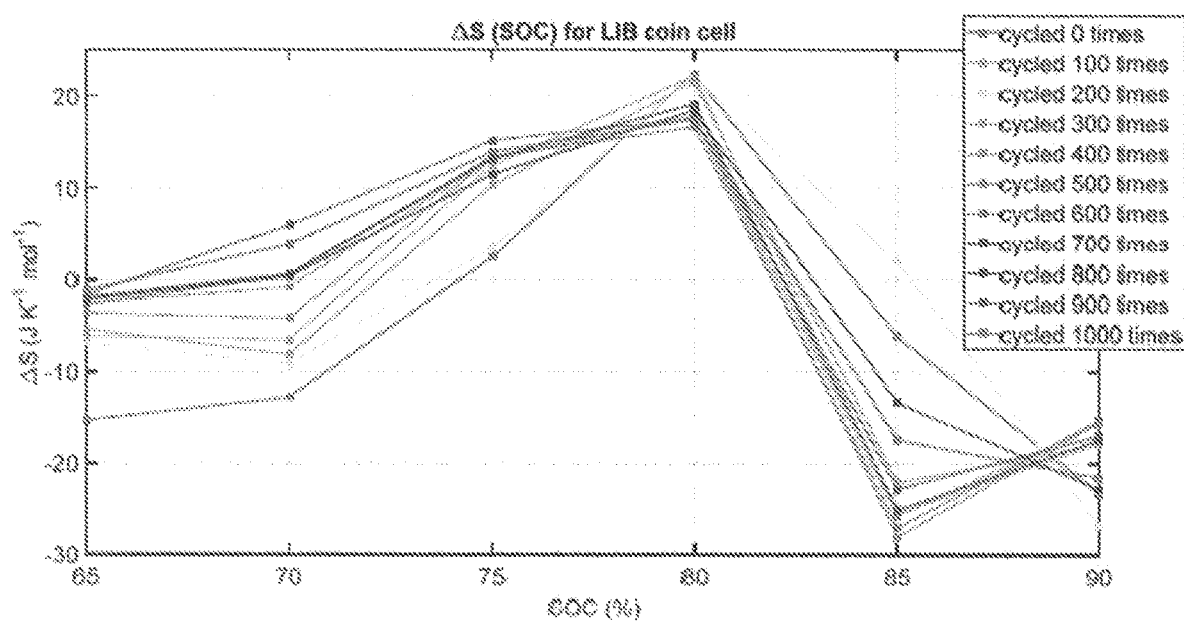

This time ΔS (SOC) is considered instead of ΔS (OCV) to show that both can be used. At FIG. 23, ΔS (SOC) profiles are plotted at different ageing. The region [65%; 90%] SOC is chosen because the profiles evolves more in this area. Data plotted in FIG. 24 are then used as input to find the model. To be more accurate, six ΔS values are used: the ones at 65, 70, 75, 80, 85 and 90% SOC.

Figure 25:
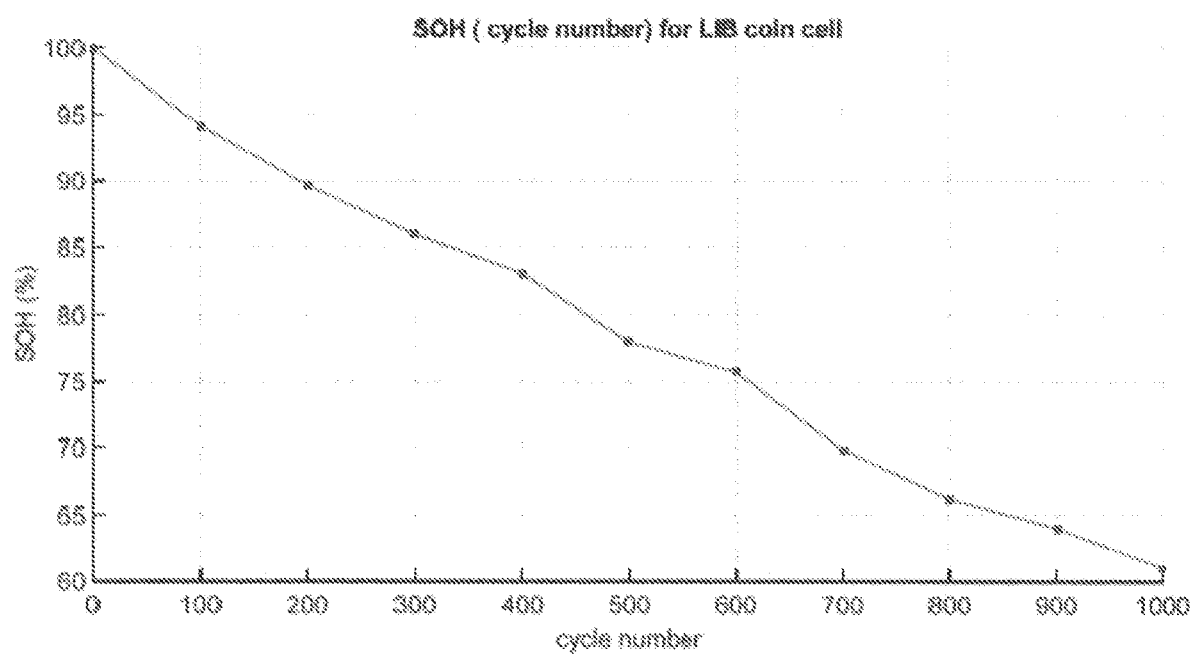
FIGS. 25-27 illustrate SOH vs Cycle Number for a LIB coin cell.
Figure 26:
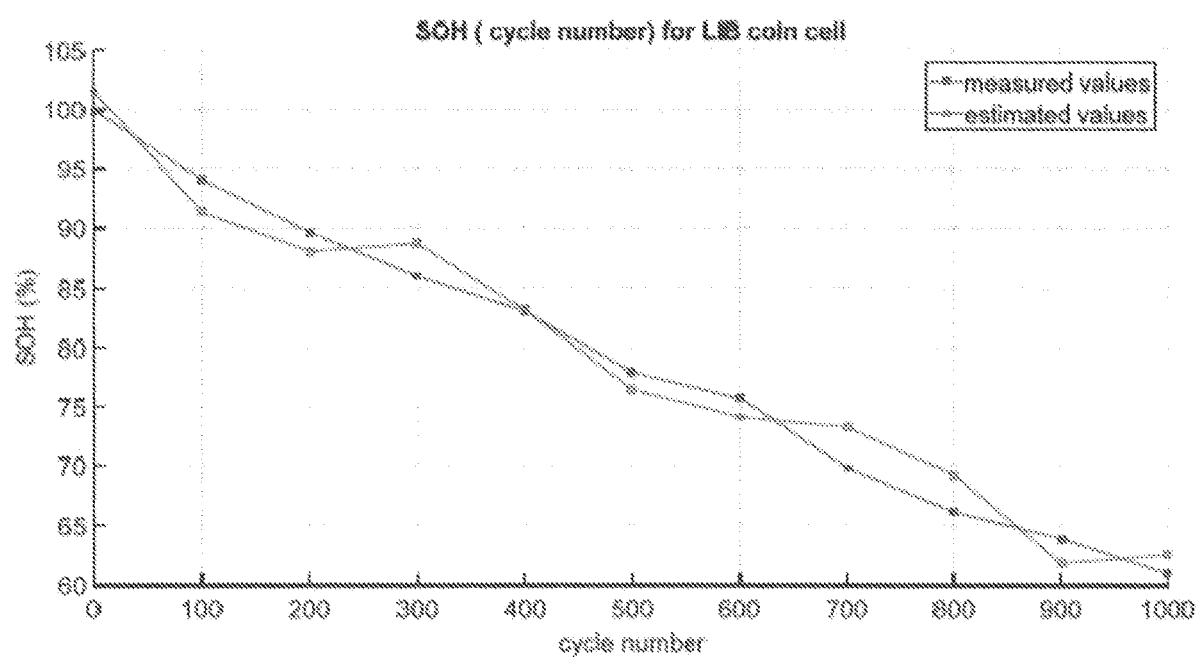
Figure 27:
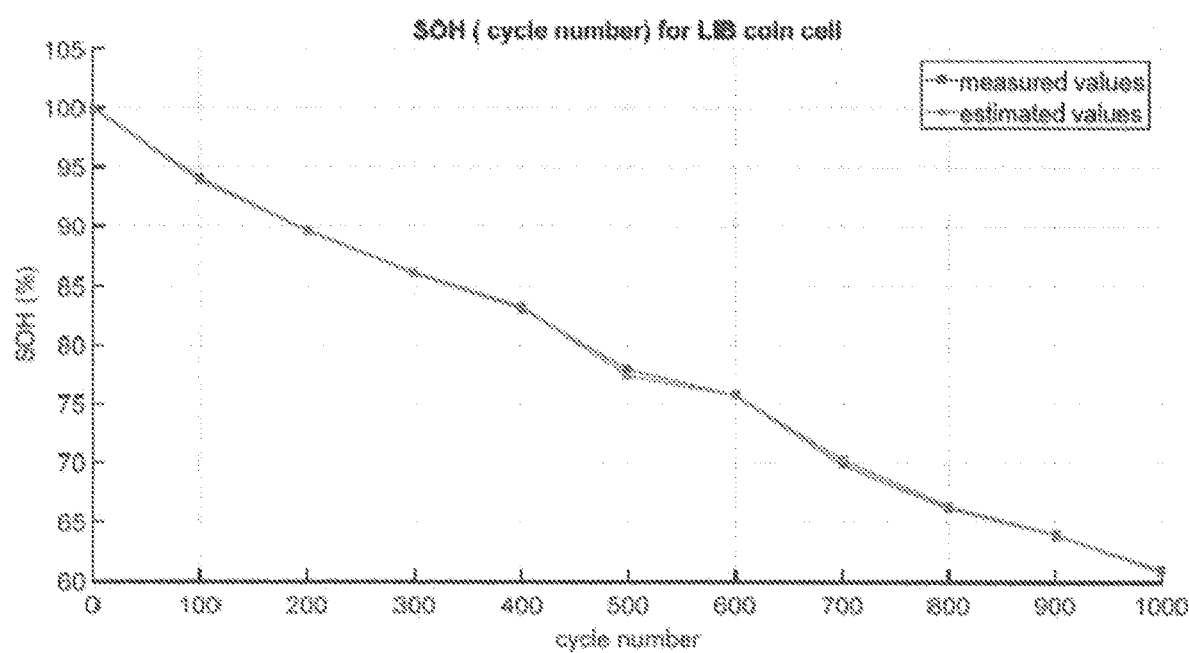

FIG. 25 shows the evolution of SOH with cycling; they are the output data used to find the model. As previously, multiple linear regression and Gaussian process regression are tested to find a model.

Multiple linear regression give a good estimation. The max error is 3.4% and the mean error is 2.2%. The estimated and measures SOH are plotted on FIGS. 26 and 27.

For the Gaussian process regression a max error of 0.5% is found. The mean error is 0.2%. This model is very accurate. It is demonstrated here that even with another battery composition, the methodology developed is applicable to estimate SOH accurately.

REFERENCES

[1] M. Berecibar et al., "Critical review of state of health estimation methods of Li-ion batteries for real applications." Renewable and Sustainable Energy Reviews, Vol. 56, April 2016, pp. 572-587.

[2] Dai Haifeng, Wei Xuezhe, and Sun Zechang, "A New SOH Prediction Concept for the Power Lithium-ion Battery Used on HEVs." Vehicle Power and Propulsion Conference, 2009. VPPC '09. IEEE, October 2009.

[3] Xuezhe Wei, Bing Zhu, and Wei Xu, "Internal Resistance Identification in Vehicle Power Lithium-ion Battery and Application in Lifetime Evaluation." International Conference on Measuring Technology and Mechatronics Automation, August 2009.

[4] Juergen Remmlinger, Michael Buchholz, Markus Meiler, Peter Bernreuter, and Klaus Dietmayer, "State-of-health monitoring of lithium-ion batteries in electric vehicles by on-board internal resistance estimation." Journal of Power Sources, Vol. 196, Issue 12, Jun. 15, 2011, pp. 5357-5363

[5] Hans-Georg Schweiger et al., "Comparison of Several Methods for Determining the Internal Resistance of Lithium Ion Cells, Sensors 2010, 10, 5604-5625 (Jun. 3, 2010)."

[6] Yi-Hsien Chiang, Wu-Yang Sean, and Jia-Cheng Ke, "Online estimation of internal resistance and open-circuit voltage of lithium-ion batteries in electric vehicles." Journal of Power Sources, Vol. 196, Issue 8, Apr. 15, 2011, pp. 3921-3932.

[7] Toshio Matsushima, "Deterioration estimation of lithium-ion cells in direct current power supply systems and characteristics of 400-Ah lithium-ion cells." Journal of Power Sources, Vol. 189, Issue 1, Apr. 1, 2009, pp. 847-854.

[8] Kelsey B. Hatzell, Aabhas Sharma, and Hosam K. Fathy, "A Survey of Long-Term Health Modeling, Estimation, and Control of Lithium-Ion Batteries: Challenges and Opportunities." American Control Conference (ACC), 2012.

[9] Paul Buschel, Uwe Troltzsch, and Olfa Kanoun, "Use of stochastic methods for robust parameter extraction from impedance spectra." Electrochimica Acta, Vol. 56, Issue 23, Sep. 30, 2011, pp. 8069-8077.

[10] E. Meissner and G. Richter, "Vehicle electric power systems are under change! Implications for design, monitoring and management of automotive batteries." Journal of Power Sources, Vol. 95, Issues 1-2, Mar. 15, 2001, pp. 13-23.

[11] Matteo Galeotti, Corrado Giammanco, Lucio Cina, Stefano Cordiner, and Aldo Di Carlo, "Diagnostic methods for the evaluation of the state of health (SOH) of NiMH batteries through electrochemical impedance spectroscopy." IEEE 23rd international Symposium on Industrial Electronics (ISIE), 2014.

[12] H. Blanke et al., "Impedance measurements on lead-acid batteries for state-of-charge, state-of-health and cranking capability prognosis in electric and hybrid electric vehicles." Journal of Power Sources, Vol. 144, Issue 2, Jun. 15, 2005, pp. 418-425.

[13] D. Andre et al., "Characterization of high-power lithium-ion batteries by electrochemical impedance spectroscopy. I. Experimental investigation." Journal of Power Sources, Vol. 196, Issue 12, Jun. 15, 2011, pp. 5334-5341.

[14] F. Huet, "A review of impedance measurements for determination of the state-of-charge or state-of-health of secondary batteries." Journal of Power Sources, Vol. 70, Issue 1, Jan. 30, 1998, pp. 59-69.

[15] V. Sauvant-Moynot et al., "ALIDISSI, a Research Program to Evaluate Electrochemical Impedance Spectroscopy as a SoC and SOH Diagnosis Tool for Li-ion Batteries." Oil & Gas Science and Technology, Rev. IFP, Vol. 65 (2010), Number 1, pp. 79-89.

[16] J. D. Kozlowski, "Electrochemical cell prognostics using online impedance measurements and model-based data fusion techniques." Aerospace Conference, Vol. 7, 2003.

[17] E. Meissner and G. Richter, "The challenge to the automotive battery industry: the battery has to become an increasingly integrated component within the vehicle electric power system." Journal of Power Sources, Vol. 144, Issue 2, Jun. 15, 2005, pp. 438-460.

[18] Kong Soon Ng, Chin-Sien Moo, Yi-Ping Chen, and Yao-Ching Hsieh, "Enhanced coulomb counting method for estimating state-of-charge and state-of-health of

[19] Juergen Remmlinger, Michael Buchholz, Thomas Soczka-Guth, and Klaus Dietmayer, "On-board state-of-health monitoring of lithium-ion batteries using linear parameter-varying models." Journal of Power Sources, Vol. 239, Oct. 1, 2013, pp. 689-695.

[20] G. L. Plett, "Extended Kalman filtering for battery management systems of LiPB-based HEV battery packs—Part 1. Background." Journal of Power Sources, Vol. 134, Issue 2, Aug. 12, 2004, pp. 252-261.

[21] G. L. Plett, "Extended Kalman filtering for battery management systems of LiPB-based HEV battery packs—Part 2. Modeling and identification." Journal of Power Sources, Vol. 134, Issue 2, Aug. 12, 2004, pp. 262-276.

[22] G. L. Plett, "Extended Kalman filtering for battery management systems of LiPB-based HEV battery packs—Part 3. State and parameter estimation." Journal of Power Sources, Vol. 134, Issue 2, Aug. 12, 2004, pp. 277-292.

[23] Rachid Yazami, Joseph McMenamin, Yvan Reynier, and Brent T. Fultz, "Methods and systems for thermodynamic evaluation of battery state of health," December 2014, U.S. Pat. No. 8,901,892B2.

[24] Kenza Maher and Rachid Yazami, "A study of lithium ion batteries cycle aging by thermodynamics techniques." Journal of Power Sources, Vol. 247, Feb. 1, 2014, pp. 527-533.

[25] Kenza Maher and Rachid Yazami, "A thermodynamic and crystal structure study of thermally aged lithium ion cells." Journal of Power Sources, Vol. 261, Sep. 1, 2014, pp. 389-400.

[26] Kenza Maher and Rachid Yazami, "Effect of overcharge on entropy and enthalpy of lithium-ion batteries." Electrochimica Acta, Vol. 101, Jul. 1, 2013, pp. 71-78.

[27] ETS patents/patent applications U.S. Pat. Nos. 8,901,892; 8,446,127; 20100090650; 20120043929; 20130271089; 20130322488; 20140354233; 20160146895.

[28] Daniel Gandolfo, Alexandre Brandao, Daniel Patino, and Marcelo Molina, "Dynamic model of lithium polymer battery—Load resistor method for electric parameters identification." Journal of the Energy Institute, Vol. 88, Issue 4, November 2015, pp. 470-479.

[29] D. Andre et al., "Characterization of high-power lithium-ion batteries by electrochemical impedance spectroscopy. II: Modelling." Journal of Power Sources, Vol. 196, Issue 12, Jun. 15, 2011, pp. 5349-5356.

The invention claimed is:

1. A method for online assessing a state of h (SOH) of an electrochemical cell, the method comprising:
   a step for estimating the state of health (SOH) of the electrochemical cell from thermodynamics data related to the electrochemical cell, the thermodynamics data including entropy and enthalpy variations $\Delta S$, $\Delta H$ within the electrochemical cell; and
   a step for implementing a model providing relationships between entropy $\Delta S$ and the state of health (SOH) for the electrochemical cell,
   wherein the $\Delta S$-SOH model has been previously obtained off-line from analyzing entropy data and relating the entropy data analysis to chemical characteristics of the electrochemical cell and then to the state of health (SOH) of the electrochemical cell, the $\Delta S$-SOH model being implemented within the entropy-revealer tool dedicated to state of health (SOH) assessment, the entropy-revealed being adapted to generate machine-learning models.

2. The method of claim 1, further comprising a step for identifying a reference and chemistry of the electrochemical cell.

3. The method of claim 1, wherein the entropy-revealer tool is adapted to fill and update a database on thermodynamics and/or chemistry and/or state of health (SOH).

4. The method of claim 1, implemented for a not already known battery, wherein the entropy-revealer tool is adapted to identify a type of battery by accessing database and machine learning models, and then to deliver an estimation of the state of health (SOH) with previously found learning models.

5. The method of 1, wherein the off-line entropy analysis detects particular open-circuit voltage (OCV) values where $\Delta S$ changes are more pronounced as the electrochemical cell ages.

6. The method of claim 1, wherein the relationships between the entropy variations $\Delta S$ and the state of health (SOH) are established by using pattern recognition algorithms.

7. The method of claim 1, wherein the step of estimating the state of health (SOH) comprises a step of estimating the state of health (SOH) from entropy variation $\Delta S$ profiles.

8. The method of claim 1, wherein the step of estimating the state of health (SOH) comprises a step of estimating the state of health (SOH) from enthalpy variation $\Delta H$ profiles.

9. The method of claim 1, wherein an entropy-revealer tool is adapted to estimate the state of health (SOH) of an electrochemical cell including a chemistry not yet referenced in a database.

10. The method of claim 1, wherein the step of estimating the state of health (SOH) from thermodynamics data comprises:
    measuring profiles of open-circuit voltage (OCV), $\Delta S$ and $\Delta H$, for different battery references and chemistries,
    measuring profiles of OCV, $\Delta S$ and $\Delta H$, for different battery states of health,
    defining which part of the profiles is relevant to identification and SOH estimation,
    finding a relationship between OCV, $\Delta S$ and $\Delta H$ profiles and battery reference or chemistry with a model.

11. The method of claim 10, wherein the step of estimating the state of health (SOH) of a battery comprises:
    measuring thermodynamics profiles,
    identifying the reference of the battery by using an entropy-revealer tool and from the measured thermodynamics profiles,
    estimating the state of health (SOH) by using the entropy-revealer tool and from the measured thermodynamics profiles.

12. A system for online assessing a state of health (SOH) of an electrochemical cell, the system comprising:
    means for estimating the state of health (SOH) of the electrochemical cell from thermodynamics data related to the electrochemical cell, the thermodynamics data including entropy and enthalpy variations $\Delta S$, $\Delta H$ within the electrochemical cell;
    means for implementing a model providing relationships between entropy $\Delta S$ and the state of health (SOH) for the electrochemical cell;
    means for analyzing entropy data and relating the entropy data analysis to chemical characteristics of the electrochemical cell and then to the state of health (SOH) of the electrochemical cell, so as to obtain off line the $\Delta S$-SOH model; and an entropy-revealer tool dedicated to state of health (SOH) assessment, being provided for implementing the ΔS-SOH model, the SOH assessment system implementing machine-learning models generated by the entropy-revealer tool.

13. The SOH assessment system of claim 12, further comprising means for identifying a reference and chemistry of the electrochemical cell.

14. The SOH assessment system of claim 12, further comprising a database on thermodynamics and/or chemistry and/or state of health (SOH), the database being filled and updated by the entropy-revealer tool.

15. The SOH assessment system of claim 12, further comprising means for detecting particular open-circuit voltage (OCV) values where ΔS changes are more pronounced as the electrochemical cell ages.

16. The SOH assessment system of claim 12, implementing pattern recognition algorithms used for establishing the relationships between entropy variations ΔS and the state of health (SOH).

17. The SOH assessment system of claim 12, wherein SOH estimation means comprise means for measuring profiles of open-circuit voltage (OCV), ΔS and ΔH, for different battery references and chemistries, means for measuring profiles of OCV, ΔS and DH, for different battery states of health, means for defining which part of the profiles is relevant to identification and SOH estimation, means for finding a relationship between OCV, ΔS and ΔH profiles in one hand and battery reference or chemistry in another hand with a model.

18. The SOH assessment system of claim 12, wherein SOH estimation means comprise:

means for measuring thermodynamics profiles, means for identifying a reference of a battery by using the entropy-revealer tool and from the measured thermodynamics profiles, means for estimating the state of health (SOH) by using the entropy-revealer tool and from the measured thermodynamics profiles.

19. A system for fast-charging a rechargeable battery with terminals connected to internal electrochemical cells, the fast-charging system comprising:

a power supply connected to the rechargeable battery and arranged for applying a time-varying charging voltage to the battery terminals, thereby generating a charging current resulting in charging of the electrochemical cells, a charging-control processor for controlling the power supply, and a system for online assessing a state of health (SOH) of the rechargeable battery, the SOH assessment system comprising:

means for estimating the state of health (SOH) of the electrochemical cells from thermodynamics data related to the rechargeable battery, the thermodynamics data including entropy and enthalpy variations ΔS, ΔH within the electrochemical cells, means for implementing a model providing relationships between entropy ΔS and the state of health (SOH) for the electrochemical cells, means for analyzing entropy data and relating the entropy data analysis to chemical characteristics of the electrochemical cells and then to the state of health (SOH) of the cells, so as to obtain off line the ΔS-SOH model, an entropy-revealer tool dedicated to state of health (SOH) assessment, being provided for implementing the ΔS-SOH model, the SOH assessment system implementing machine-learning models generated by the entropy-revealer tool.

* * * * *

UNITED STATES PATENT AND TRADEMARK OFFICE
CERTIFICATE OF CORRECTION

PATENT NO. : 11,598,816 B2
APPLICATION NO. : 16/770555
DATED : March 7, 2023
INVENTOR(S) : Rachid Yazami and Sohaïb El Outmani It is certified that error appears in the above-identified patent and that said Letters Patent is hereby corrected as shown below:

On the Title Page
In ITEM (57), Line 6, change "the cell the" to --the cell, the--

In the Specification
Column 1, Line 21, change "online SOFT" to --online SOH--

In the Claims
Claim 1, Column 13, Line 51, change "of h (SOH)" to --of health (SOH)--
Claim 1, Column 13, Line 66, change "within the" to --within an--
Claim 1, Column 14, Line 1, change "entropy-revealed" to --entropy-revealer tool--
Claim 5, Column 14, Line 15, change "of 1" to --of claim 1--

Signed and Sealed this
Eighteenth Day of July, 2023

Katherine Kelly Vidal
*Director of the United States Patent and Trademark Office*